United States Patent
Satou et al.

(10) Patent No.: US 8,348,456 B2
(45) Date of Patent: Jan. 8, 2013

(54) ILLUMINATING DEVICE

(75) Inventors: Yoshihito Satou, Ushiku (JP); Yasunori Matsushita, Yokkaichi (JP); Akeo Kasakura, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 363 days.

(21) Appl. No.: 12/377,182

(22) PCT Filed: Aug. 9, 2007

(86) PCT No.: PCT/JP2007/065627
§ 371 (c)(1),
(2), (4) Date: Mar. 12, 2009

(87) PCT Pub. No.: WO2008/018548
PCT Pub. Date: Feb. 14, 2008

(65) Prior Publication Data
US 2010/0171440 A1 Jul. 8, 2010

(30) Foreign Application Priority Data
Aug. 11, 2006 (JP) ................. 2006-220025

(51) Int. Cl.
*F21V 9/00* (2006.01)
(52) U.S. Cl. .......................... 362/231; 362/84
(58) Field of Classification Search .............. 362/231, 362/84, 249.02
See application file for complete search history.

(56) References Cited

U.S. PATENT DOCUMENTS

| | | | |
|---|---|---|---|
| 6,682,207 B2 * | 1/2004 | Weber et al. | 362/293 |
| 7,052,152 B2 * | 5/2006 | Harbers et al. | 362/30 |
| 7,101,061 B2 | 9/2006 | Nagai et al. | |
| 7,163,327 B2 * | 1/2007 | Henson et al. | 362/554 |
| 2004/0129946 A1 | 7/2004 | Nagai et al. | |
| 2004/0190304 A1 | 9/2004 | Sugimoto et al. | |
| 2006/0126326 A1 | 6/2006 | Ng et al. | |
| 2009/0046453 A1 * | 2/2009 | Kramer | 362/231 |
| 2010/0141172 A1 | 6/2010 | Uchida et al. | |

FOREIGN PATENT DOCUMENTS

| | | |
|---|---|---|
| JP | 2000 183408 | 6/2000 |
| JP | 2001 351404 | 12/2001 |
| JP | 2002 50795 | 2/2002 |
| JP | 2003-110146 | 4/2003 |
| JP | 2004 140185 | 5/2004 |
| JP | 2004 161841 | 6/2004 |

(Continued)

OTHER PUBLICATIONS

English translation of Masaru, JP 2006/032364.*

(Continued)

*Primary Examiner* — Evan Dzierzynski
(74) *Attorney, Agent, or Firm* — Oblon, Spivak, McClelland, Maier & Neustadt, L.L.P.

(57) ABSTRACT

An illuminating device has a solid light-emitting element module and a phosphor module joined to the solid light-emitting element module. The solid light-emitting element module has a plurality of the solid light-emitting elements. The phosphor module has a plurality of phosphor-containing parts corresponding to the individual solid light-emitting elements. Thus, a light-emitting part is provided, which has more than one kind of luminescence sources having the solid light-emitting element and the phosphor-containing part. An illumination intensity of a composite light is 150 lux or more at a distance of 30 cm perpendicularly from the light-emitting surface of the light-emitting part.

6 Claims, 6 Drawing Sheets

FOREIGN PATENT DOCUMENTS

| | | |
|---|---|---|
| JP | 2005 19874 | 1/2005 |
| JP | 2005 216782 | 8/2005 |
| JP | 2005 243608 | 9/2005 |
| JP | 2006 32364 | 2/2006 |
| JP | 2006 156187 | 6/2006 |
| JP | 2006 173622 | 6/2006 |
| JP | 2006 179684 | 7/2006 |
| WO | WO 2006/085693 A1 | 8/2006 |

OTHER PUBLICATIONS

English translation of Hideo, JP 2005-019874.*

U.S. Appl. No. 12/742,515, filed May 12, 2010, Kasakura, et al.

* cited by examiner (a)

| R | B | G |
|---|---|---|
| G | R | B |
| B | G | R |

R = 3
G = 3
B = 3

(b)

| R | G | R |
|---|---|---|
| G | B | G |
| R | G | R |

R = 4
G = 4
B = 1

(c)

| G | R | B |
|---|---|---|
| R | G | R |
| B | R | G |

R = 4
G = 3
B = 2

(d)

| R | G | R |
|---|---|---|
| B | R | B |
| R | G | R |

R = 5
G = 2
B = 2

(e)

| R | G | B |
|---|---|---|
| R | G | B |
| R | G | B |

R = 3
G = 3
B = 3

(f)

| R | B | G |
|---|---|---|
| G | B | R |
| R | B | G |

R = 3
G = 3
B = 3

(g) = (a)

| R | B | G |
|---|---|---|
| G | R | B |
| B | B | R |

R = 3
G = 3
B = 3

(h)

| B | B | R |
|---|---|---|
| B | R | B |
| B | B | R |

R = 3
G = 3
B = 3

ILLUMINATING DEVICE

TECHNICAL FIELD

The present invention relates to an illuminating device emitting composite light. In particular, the invention relates to an illuminating device comprising integrated luminescence sources having a light-emitting element and a phosphor, emitting a composite light of primary lights from the luminescence sources.

BACKGROUND ART

In the past, a variety of devices such as fluorescent lamps have been used as a white illuminating device. Recently, there have been developed new light sources such as inorganic ELs (Electro Luminescence), organic ELs (OEL (Organic Electro Luminescence) and OLEDs (Organic Light Emitting Diode)) and semiconductor light-emitting elements, which have been used for developing an illuminating device. For example, for an illuminating device such as an LED lamp using a semiconductor light-emitting element, the surface of the semiconductor light-emitting element is coated with a phosphor, or powder of the phosphor is contained in a resin constituting the LED lamp to practically realize other emission colors, for example white, than the original emission color from the semiconductor light-emitting element. In such illuminating device, a GaN-based semiconductor light-emitting element emitting blue light with a center wavelength approximately 460 nm is generally utilized. More specifically, the surface of the GaN-based semiconductor light-emitting element emitting blue light has a phosphor-containing layer containing yellow-light emitting cerium-activated yttrium aluminate (YAG) phosphor, and the phosphor-containing layer converts a light from the semiconductor light-emitting element to obtain white light.

For such illuminating device using such the semiconductor light-emitting element, there has been such a problem that the central part of the irradiation face looks blue and a yellow ring is produced at its circumference because of passing through the blue color of excitation light, resulting in uneven coloring and non-uniform white on the irradiation face.

To solve this problem, Patent Document 1 and Patent Document 2 propose a structure of disposing a lens having the central emission face with a convex lens shape to emit the emission light outside, and a structure of disposing a shading member to cut the outskirts part of the emission light, respectively.

Patent Document 3 proposes a structure of using a semiconductor light emitting element (LED chip) emitting ultraviolet light, a first phosphor layer comprising a blue-light-emitting phosphor absorbing the ultraviolet light and emitting blue light is formed on the LED chip, and a second phosphor layer comprising a luteofulvous-light-emitting phosphor absorbing the blue light and emitting luteofulvous light is formed on the first phosphor layer.

Patent Document 1: JPA 2005-216782
Patent Document 2: JPA 2005-243608
Patent Document 3: JPA 2000-183408

DISCLOSURE OF THE INVENTION

Subject to Be Solved by the Invention

However, in the structures described in Patent Documents 1 and 2, the illuminating devices are complicated because they have extra lens and shading member with a specific structure. The structure described in Patent Document 3 provides low color rendering properties on the irradiation face due to scarcity of red color component.

The present invention has been made in view of the above mentioned problems and it is an object thereof to provide an illuminating device having a simple structure without using extra optical members such as the lens and shading member with a specific structure, not producing unevenness or rings in color or brightness on the irradiation face, and having excellent uniformity in light emission and excellent property in color rendering.

Means to Solve the Subject

The present invention solves the problems described above and the gist of invention is as follows.

[1] An illuminating device comprising a light-emitting part having more than one kind of luminescence sources disposed integrally, each kind of which emits a primary light with a different wavelength, wherein said luminescence source includes a solid light-emitting element and a phosphor, and an illumination intensity of a composite light at a distance of 30 cm from the light-emitting surface of said light-emitting part in a perpendicular direction is 150 lux or more.

[2] The illuminating device according to the above described item [1], wherein the composite light is white when it is observed at a distance of at least 10 cm from the light-emitting surface of said light-emitting part in a perpendicular direction.

[3] The illuminating device according to the above described item [1] or [2], wherein an area of a light-outgoing part of said luminescence sources is 0.1 mm$^2$ to 100 mm$^2$; said luminescence sources emit a light having emission peak wavelengths in a first wavelength range of 430 nm or more and less than 500 nm, a second wavelength range of 500 nm or more and less than 580 nm and a third wavelength range of 580 nm or more and 700 nm or less; and an energy ratio of the light-outgoing part of said luminescence sources is $E_1:E_2:E_3$=5 to 90:5 to 90:5 to 90 where an energy of a light having an emission peak wavelength in said first wavelength range is $E_1$, an energy of a light having an emission peak wavelength in said second wavelength range is $E_2$ and an energy of a light having an emission peak wavelength in said third wavelength range is $E_3$.

[4] The illuminating device according to the above described item [3], further comprising a controller controlling the driving conditions of said luminescence sources for each of said first to third wavelength ranges.

[5] The illuminating device according to any one of the above described items [1] to [4], wherein said luminescence sources comprise a solid light-emitting element module formed by assembling said solid light-emitting elements as a module and a phosphor module formed by assembling said phosphors as a module.

[6] The illuminating device according to the above described item [5], wherein said solid light-emitting element module comprises a base and a solid light-emitting element disposed on said base.

[7] The illuminating device according to the above described item [5] or [6], wherein said phosphor module comprises a base and a phosphor-containing part containing said phosphor disposed on said base.

[8] The illuminating device according to any one of the above described items [5] to [7], wherein said solid light-emitting element module comprises a plurality of said solid light-emitting elements; said phosphor module contains a phosphor at a position corresponding to each of said plurality of solid light-emitting elements; and said solid light-emitting element module and said phosphor module are joined to constitute a light-emitting part where said more than one kind of luminescence sources are disposed integrally.

Effect of the Invention

According to the present invention, the illuminating device can be provided, which has a simple structure, excellent uniformity in light emission without producing unevenness or rings in color or brightness on the irradiation face, and excellent property in color rendering.

DESCRIPTION OF REFERENCE NUMERALS

Figure 1:
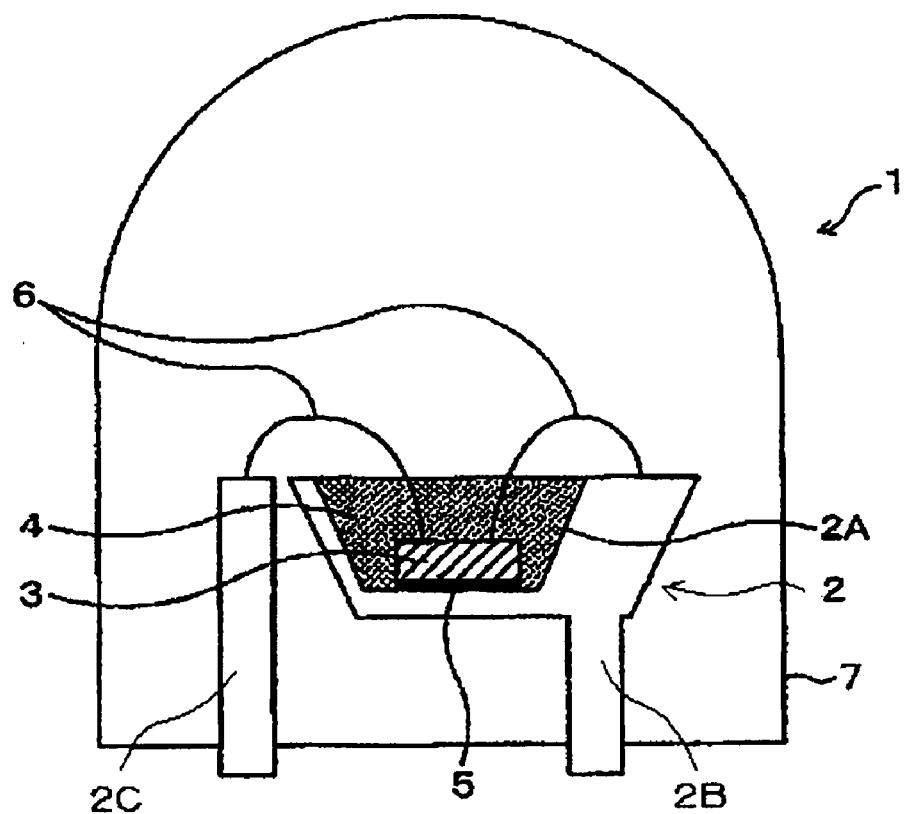
FIG. 1 is a schematic cross-sectional view showing Embodiment 1 of a luminescence source according to the present invention.

| | |
|---|---|
| 1 | LED lamp |
| 2 | Frame |
| 2A | Concave portion |
| 3 | LED (light-emitting element) |
| 4 | Phosphor-containing part |
| 5 | Adhesive |
| 6 | Wire |
| 7 | Molded part (light distribution controlling element) |
| 10 | Solid light-emitting element module |
| 11 | Base |
| 12 | Solid light-emitting element |
| 20 | Phosphor module |
| 21 | Base |
| 22 | Phosphor-containing part |
| 100 | LED |
| L | Structure axis. |

BEST MODE FOR CARRYING THE INVENTION

The present invention will be described in detail below, but the present invention is not limited to embodiments shown below and can be carried out in various modifications without departing from the scope of the present invention.

An illuminating device according to the present invention comprises a light-emitting part having more than one kind of luminescence sources disposed integrally, each kind of which emits a primary light with a different wavelength, characterized in that said luminescence sources includes a solid light-emitting element and a phosphor, and an illumination intensity of a composite light at a distance of 30 cm from the light-emitting surface of said light-emitting part in a perpendicular direction is 150 lux or more.

There will be detailed individual components.

[1] Luminescence Source

A luminescence source used in an illuminating device according to the present invention is significant for emitting a primary light to be a component of a composite light in an illuminating device of the present invention.

A luminescence source used in the present invention contains a solid light-emitting element and a phosphor, and may, if necessary, contain other optional component.

A specific example of the luminescence source may be an LED lamp using a semiconductor light-emitting element.

There will be detailed constitutional components for the luminescence source used in the present invention.

[1-1] Solid Light-Emitting Element

A solid light-emitting element used in the present invention emits a light exciting a phosphor as later described in [1-2]. The emission wavelength of the solid light-emitting element is not particularly restricted and the solid light-emitting element with the emission wavelength in a wide rage may be used as long as it overlaps with the absorption wavelength of the phosphor.

The type of the solid light-emitting element used in the illuminating device according to the present invention is not particularly restricted and may include semiconductor light-emitting elements, inorganic Els, organic Els and the like. Among them, the semiconductor light-emitting element is preferably used from a viewpoint of a longer operating life, energy saving, a low-calorific power, high-speed response, shork resistance, size and weight reduction and environment resistance.

As the semiconductor light-emitting element, a light-emitting diode (LED), a semiconductor laser diode (LD) and the like may be specifically used. An emission peak wavelength of the semiconductor light-emitting element is an important factor related to an excitation efficiency of a phosphor and consequently to a conversion efficiency from an excitation light to a fluorescence of a phosphor, and is generally a light-emitting element having an emission wavelength from near-ultraviolet region to blue region, and as a specific value the light-emitting element having a peak emission wavelength of usually 300 nm or more, preferably 330 nm or more and usually 500 nm or less, preferably 480 nm or less may be used.

Among them, the GaN-based LED and LD using the GaN-based compound semiconductor are preferable. This is because that GaN-based LED and LD produce significantly large emission output and external quantum efficiency compared to the SiC-based LED emitting the light in this region, and extremely bright light emission with extremely low electrical power can be obtained in combination with the phosphor previously described. For example, the GaN-based LED and LD usually have one hundred or more times emission intensity of that of the SiC-based LED and LD by the same electrical current load. Among the GaN-based LEDs and LDs, those having the $Al_xGa_yN$ luminescent layer, the GaN luminescent layer or the $In_xGa_yN$ luminescent layer are preferable. Among the GaN-based LEDs, those having the $In_x$-$Ga_yN$ luminescent layer are particularly preferable due to their extremely intense emission intensity; and among the GaN-based LDs, those having the multiquantum well structure of the $In_xGa_yN$ layer and the GaN layer are particularly preferable due to their extremely intense emission intensity.

In the cases described above, the value of X+Y is usually a value within the range from 0.8 to 1.2. The GaN-based LED in which Zn and/or Si is doped into these luminescent layers or without dopants is preferable for the adjustment of emission properties.

The GaN-based LED comprises the luminescent layer, a p layer, an n layer, an electrode, and a substrate as basic constituents, and those having the luminescent layer of the hetero-structure of the lamination with the n-type and p-type $Al_xGa_yN$ layer, GaN layer, or $In_xGa_yN$ layer are preferable due to their high luminescent efficiency, and furthermore those in which the hetero-structure is the quantum well structure are more preferable due to their higher luminescent efficiency.

A growing method of a GaN-based crystal layer for forming a GaN-based semiconductor light-emitting element may be included, for example, HVPE method, MOVPE method or MBE method. A thick film may be preferably formed by HYPE method while a thin film may be preferably formed by MOVPE method or MBE method.

[1-2] Phosphor

A phosphor used for the illuminating device according to the present invention is excited by an emitted light from the solid light-emitting element described in [1-1] to convert a light from the solid light-emitting element into a light having a different wavelength.

By using a light converted by the phosphor as a luminescence source, primary lights can be mixed at a short distance from the luminescence source irrespective of a package shape, resulting in a white composite light.

Although there are no particular restrictions to a composition of such a phosphor, an oxide or nitride phosphor is preferable because it extends the life of the semiconductor light-emitting element and the illuminating device due to its chemical stability. Among them, preferred is a combination of a crystal matrix, such as an metal oxide represented by $Y_2O_3$ and $Zn_2SiO_4$, a metal nitride represented by $Sr_2Si_5N_8$, a phosphate represented by $Ca_5(PO_4)_3Cl$ and a sulfide represented by ZnS, SrS and CaS, and an activating element or co-activating element such as an ionic rare-earth metal represented by Ce, Pr, Nd, Pm, Sm, Eu, Tb, Dy, Ho, Er, Tm and Yb and an ionic metal represented by Ag, Cu, Au, Al, Mn and Sb.

Preferable examples of the crystal matrix include sulfides such as (Zn,Cd)S, $SrGa_2S_4$, SrS and ZnS; oxysulfides such as $Y_2O_2S$; aluminates such as $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_2O_{19}$, $CeMgAl_{10}O_{19}$, $(Ba,Sr,Mg)O.Al_2O_3$, $BaAl_{12}Si_2O_8$, $SrAl_2O_4$, $Sr_4Al_{14}O_{25}$ and $Y_3Al_5O_{12}$; silicates such as $Y_2SiO_5$ and $Zn_2SiO_4$; oxides such as $SnO_2$ and $Y_2O_3$; borates such as $GdMgB_5O_{10}$ and $(Y,Gd)BO_3$; halophosphates such as $Ca_{10}(PO_4)_6(F,Cl)_2$ and $(Sr,Ca,Ba,Mg)_{10}(PO_4)_6Cl_2$; and phosphates such as $Sr_2P_2O_7$ and $(La,Ce)PO_4$.

There are no particular restrictions to an elemental composition of the crystal matrix and the activating or co-activating element, and it may be partly replaced with a homologous element and a resulting phosphor may be used as long as it can absorb a light in the near ultraviolet to the visible region to emit a visible light.

Specific examples of the phosphor may include the followings, which are just illustrative and phosphors which can be used in the present invention are not limited to these. In the following examples, phosphors having a partly different structure are collectively listed as appropriate. For example, "$Y_2SiO_5:Ce^{3+}$", "$Y_2SiO_5:Tb^{3+}$" and "$Y_2SiO_5:Ce^{3+},Tb^{3+}$" are collectively listed as "$Y_2SiO_5:Ce^{3+},Tb^{3+}$"; "$La_2O_2S:Eu$", "$Y_2O_2S:Eu$" and "$(La,Y)_2O_2S:Eu$" are collectively listed as "$(La,Y)_2O_2S:Eu$". An abbreviated part is indicated by delimiting a comma (,). The total of elements in ( ) is one mole.

A fluorescence color of the phosphor used in the present invention may be selected from various colors depending on an intended purpose of the illuminating device of the present invention; specifically, the followings may be used.

[1-2-1] Orange or Red Phosphor

A base phosphor generating orange and/or red fluorescence (hereinafter, appropriately, a base phosphor generating orange fluorescence is referred to as an "orange phosphor" and a base phosphor generating red fluorescence is referred to as a "red phosphor", and a base phosphor generating orange and/or red fluorescence is referred to as an "orange and/or red phosphor") may include the followings.

As a specific example, a fluorescence generated by a red phosphor suitable for the present invention has a wavelength in such a range that a major emission peak wavelength is usually 570 nm or more, preferably 580 nm or more, particularly preferably 610 nm or more and usually 700 nm or less, preferably 680 nm or less, particularly preferably 660 nm or less.

A full width at half maximum of the major emission peak is usually 1 nm or more, preferably 10 nm or more, particularly preferably 30 nm or more and usually 120 nm or less, preferably 110 nm or less, particularly preferably 100 nm or less.

If the wavelength of the major emission peak is longer than the range described above, an illumination intensity of the illuminating device may be reduced (become dark) due to decrease in luminosity factor, and in the case of the shorter wavelength, the color rendering property may be degraded as being the illuminating device. Furthermore, if the full width at half maximum of the major emission peak is outside the range described above, the color rendering property may be degraded as being the illuminating device.

Examples of an orange and/or red phosphor include an europium-activated alkaline-earth silicon nitride phosphor represented by $(Mg,Ca,Sr,Ba)_2Si_5N_8:Eu$ consisting of breaking particles having a red broken-out section which generates a light in the red region and an europium-activated rare earth oxychalcogenide phosphor represented by $(Y,La,Gd,Lu)_2O_2S:Eu$ consisting of growing particles having a substantially spherical shape as a regular crystal growth shape which generates a light in the red region.

In this embodiment, there may be used a phosphor containing an oxynitride and/or oxysulfide containing at least one element selected from the group consisting of Ti, Zr, Hf, Nb, Ta, W and Mo and containing an oxynitride having an alpha-sialon structure where Al element is entirely or partly replaced by Ga element, as described in JPA 2004-300247. These are phosphors containing an oxynitride and/or an oxysulfide.

Additionally, the red phosphor may include Eu-activated oxysulfide phosphors such as $(La,Y)_2O_2S:Eu$; Eu-activated oxide phosphors such as $Y(V,P)O_4:Eu$ and $Y_2O_3:Eu$; Eu,Mn-activated silicate phosphors such as $(Ba,Sr,Ca,Mg)_2SiO_4:Eu,Mn$ and $(Ba,Mg)_2SiO_4:Eu,Mn$; Eu-activated sulfide phosphors such as (Ca,Sr)S:Eu; Eu-activated aluminate phosphors such as $YAlO_3:Eu$; Eu-activated silicate phosphors such as $LiY_9(SiO_4)_6O_2:Eu$, $Ca_2Y_8(SiO_4)_6O_2:Eu$, $(Sr,Ba,Ca)_3SiO_5:Eu$ and $Sr_2BaSiO_5:Eu$; Ce-activated aluminate phosphors such as $(Y,Gd)_3Al_5O_{12}:Ce$ and $(Tb,Gd)_3Al_5O_{12}:Ce$; Eu-activated nitride phosphors such as $(Ca,Sr,Ba)_2Si_5N_8$:Eu, $(Mg,Ca,Sr,Ba)SiN_2$:Eu and $(Mg,Ca,Sr,Ba)AlSiN_3$:Eu; Ce-activated nitride phosphors such as $(Mg,Ca,Sr,Ba)AlSiN_3$:Ce; Eu,Mn-activated halophosphate phosphors such as $(Sr,Ca,Ba,Mg)_{10}(PO_4)_6Cl_2$:Eu,Mn; Eu,Mn-activated silicate phosphors such as $Ba_3MgSi_2O_8$:Eu,Mn and $(Ba,Sr,Ca,Mg)_3(Zn,Mg)Si_2O_8$:Eu,Mn; Mn-activated germanate phosphors such as $3.5MgO.0.5MgF_2.GeO_2$:Mn; Eu-activated oxynitride phosphors such as Eu-activated alpha-sialon; Eu,Bi-activated oxide phosphors such as $(Gd,Y,Lu,La)_2O_3$:Eu,Bi; Eu,Bi-activated oxysulfide phosphors such as $(Gd,Y,Lu,La)_2O_2S$:Eu,Bi; Eu,Bi-activated vanadate phosphors such as $(Gd,Y,Lu,La)VO_4$:Eu,Bi; Eu, Ce-activated sulfide phosphors such as $SrY_2S_4$:Eu, Ce; Ce-activated sulfide phosphors such as $CaLa_2S_4$:Ce; Eu,Mn-activated phosphate phosphors such as $(Ba,Sr,Ca)MgP_2O_7$:Eu,Mn and $(Sr,Ca,Ba,Mg,Zn)_2P_2O_7$:Eu,Mn; Eu,Mo-activated tungstate phosphors such as $(Y,Lu)_2WO_6$:Eu,Mo; Eu, Ce-activated nitride phosphors such as $(Ba,Sr,Ca)_xSi_yN_z$:Eu, Ce (where x, y and z are an integer of 1 or more); Eu,Mn-activated halophosphate phosphors such as $(Ca,Sr,Ba,Mg)_{10}(PO_4)_6(F,Cl,Br,OH)_2$:Eu,Mn; and Ce-activated silicate phosphors such as $((Y,Lu,Gd,Tb)_{1-x}Sc_xCe_y)_2(Ca,Mg)_{1-r}(Mg,Zn)_{2+r}Si_{z-g}GeqO_{12+\delta}$.

The red phosphor may also include a red organic phosphor consisting of a rare-earth ion complex having an anion such as a β-diketonate, a δ-diketone, an aromatic carboxylic acid or a Broensted acid as a ligand, perylene pigments (for example, dibenzo{[f,f']-4,4',7,7'-tetraphenyl}diindeno[1,2,3-cd:1',2',3'-lm]perylene), anthraquinone pigments, lake pigments, azo pigments, quinacridone pigments, anthracene pigments, isoindoline pigments, isoindolinone pigments, phthalocyanine pigments, triphenylmethane basic dyes, indanthrone pigments, indophenol pigments, cyanine pigments and dioxazine pigments.

The red phosphor whose peak wavelength is within the range of 580 nm or more, preferably 590 nm or more and 620 nm or less, preferably 610 nm or less, can be suitably used as an orange phosphor. Examples of such an orange phosphor include Eu-activated oxynitride phosphors such as $(Sr,Ba)_3SiO_5$:Eu, $(Sr,Mg)_3(PO_4)_2$:Sn and Eu-activated sialon.

[1-2-2] Green Phosphor

A base phosphor generating green fluorescence (hereinafter, referred to as "green phosphor" as appropriate) includes the followings.

As a specific example, a fluorescence generated by a green phosphor suitable for the present invention has a wavelength in such a range that a major emission peak wavelength is usually 500 nm or more, preferably 510 nm or more, particularly preferably 520 nm or more and usually 580 nm or less, preferably 570 nm or less, particularly preferably 560 nm or less.

A full width at half maximum of the major emission peak is usually 1 nm or more, preferably 10 nm or more, particularly preferably 30 nm or more and usually 120 nm or less, preferably 90 nm or less, particularly preferably 60 nm or less.

If the wavelength of the major emission peak is shorter than the range described above, an illumination intensity of the illuminating device may be reduced (become dark) due to decrease in luminosity factor, and in the case of the longer wavelength, the color rendering property may be degraded as being the illuminating device.

Furthermore, if the full width at half maximum of the major emission peak is outside the range described above, the color rendering property may be degraded as being the illuminating device.

Examples of such green phosphor include an europium-activated alkaline-earth silicon oxynitride phosphor represented by $(Mg,Ca,Sr,Ba)Si_2O_2N_2$:Eu consisting of breaking particles having a broken-out section which generates a light in the green region and an europium-activated alkaline-earth silicate phosphor represented by $(Ba,Ca,Sr,Mg)_2SiO_4$:Eu consisting of breaking particles having a broken-out section which generates a light in the green region.

Additionally, the green phosphor may include Eu-activated aluminate phosphors such as $Sr_4Al_{14}O_{25}$:Eu and $(Ba,Sr,Ca)Al_2O_4$:Eu; Eu-activated silicate phosphors such as $(Sr,Ba)Al_2Si_2O_8$:Eu, $(Ba,Mg)_2SiO_4$:Eu, $(Ba,Sr,Ca,Mg)_2SiO_4$:Eu and $(Ba,Sr,Ca)_2(Mg,Zn)Si_2O_7$:Eu; Ce,Tb-activated silicate phosphors such as $Y_2SiO_5$:Ce,Tb; Eu-activated borate-phosphate phosphors such as $Sr_2P_2O_7-Sr_2B_2O_5$:Eu; Eu-activated halosilicate phosphors such as $Sr_2Si_3O_8\text{-}2SrCl_2$:Eu; Mn-activated silicate phosphors such as $Zn_2SiO_4$:Mn; Tb-activated aluminate phosphors such as $CeMgAl_{11}O_{19}$:Tb and $Y_3Al_5O_{12}$:Tb; Tb-activated silicate phosphors such as $Ca_2Y_8(SiO_4)_6O_2$:Tb and $La_3Ga_5SiO_{14}$:Tb; Eu,Tb,Sm-activated thiogallate phosphors such as $(Sr,Ba,Ca)Ga_2S_4$:Eu,Tb,Sm; Ce-activated aluminate phosphors such as $Y_3(Al,Ga)_5O_{12}$:Ce and $(Y,Ga,Tb,La,Sm,Pr,Lu)_3(Al,Ga)_5O_{12}$:Ce; Ce-activated silicate phosphors such as $Ca_3Sc_2Si_3O_{12}$:Ce and $Ca_3(Sc,Mg,Na,Li)_2Si_3O_{12}$:Ce; Ce-activated oxide phosphors such as $CaSc_2O_4$:Ce; Eu-activated oxynitride phosphors such as $SrSi_2O_2N_2$:Eu, $(Sr,Ba,Ca)Si_2O_2N_2$:Eu and Eu-activated β-sialon; Eu,Mn-activated aluminate phosphors such as $BaMgAl_{10}O_{17}$:Eu,Mn; Eu-activated aluminate phosphors such as $SrAl_2O_4$:Eu; Tb-activated oxysulfide phosphors such as $(La,Gd,Y)_2O_2S$:Tb; Ce,Tb-activated phosphate phosphors such as $LaPO_4$:Ce,Tb; sulfide phosphors such as ZnS:Cu,Al and ZnS:Cu,Au,Al; Ce,Tb-activated borate phosphors such as $(Y,Ga,Lu,Sc,La)BO_3$:Ce,Tb, $Na_2Gd_2B_2O_7$:Ce,Tb and $(Ba,Sr)_2(Ca,Mg,Zn)B_2O_6$:K,Ce,Tb; Eu,Mn-activated halosilicate phosphors such as $Ca_8Mg(SiO_4)_4Cl_2$:Eu,Mn; Eu-activated thioaluminate phosphors such as $(Sr,Ca,Ba)(Al,Ga,In)_2S_4$:Eu; and Eu,Mn-activated halosilicate phosphors such as thiogallate phosphor and $(Ca,Sr)_8(Mg,Zn)(SiO_4)_4Cl_2$:Eu,Mn.

Alternatively, fluorescence dyes such as pyridine-phthalimide fused derivatives, benzoxazinones, quinazolinones, coumarins, quinophthalones and narthalic imides; and organic phosphors such as terbium complexes may be used as the green phosphor.

[1-2-3] Blue Phosphor

A base phosphor generating blue fluorescence (hereinafter, referred to as "blue phosphor" as appropriate) includes the followings.

As a specific example, a fluorescence generated by a blue phosphor suitable for the present invention has a wavelength in such a range that a major emission peak wavelength is usually 430 nm or more, preferably 440 nm or more and usually 500 nm or less, preferably 480 nm or less, particularly preferably 460 nm or less.

A full width at half maximum of the major emission peak is usually 1 nm or more, preferably 10 nm or more, particularly preferably 30 nm or more and usually 100 nm or less, preferably 80 nm or less, particularly preferably 70 nm or less.

If the wavelength of the major emission peak is shorter than the range described above, an illumination intensity of the illuminating device may be reduced (become dark) due to decrease in luminosity factor, and in the case of the longer wavelength, the color rendering property may be degraded as being the illuminating device.

Furthermore, if the full width at half maximum of the major emission peak is outside the range described above, the color rendering property may be degraded as being the illuminating device.

Examples of such blue phosphor include an europium-activated barium-magnesium aluminate phosphor represented by $BaMgAl_{10}O_{17}$:Eu consisting of growing particles having a substantially hexagonal shape as a regular crystal growth shape which generates a light in the blue range; an europium-activated calcium halophosphate phosphor represented by $(Ca,Sr,Ba)_5(PO_4)_3Cl$:Eu consisting of growing particles having a substantially spherical shape as a regular crystal growth shape which generates a light in the blue range; an europium-activated alkaline-earth chloroborate phosphor represented by $(Ca,Sr,Ba)_2B_5O_9Cl$:Eu consisting of growing particles having a substantially cubic shape as a regular crystal growth shape which generates a light in the blue range; and an europium-activated alkaline-earth aluminate phosphor represented by $(Sr,Ca,Ba)Al_2O_4$:Eu or $(Sr,Ca,Ba)_4Al_{14}O_{25}$:Eu consisting of breaking particles having a broken-out section which generates a light in the blue range.

Additionally, the blue phosphor may include Sn-activated phosphate phosphors such as $Sr_2P_2O_7$:Sn; Eu-activated aluminate phosphors such as $Sr_4Al_{14}O_{25}$:Eu, $BaMgAl_{10}O_{17}$:Eu and $BaAl_8O_{13}$:Eu; Ce-activated thiopgallate phosphors such as $SrGa_2S_4$:Ce and $CaGa_2S_4$:Ce; Eu-activated aluminate phosphors such as $(Ba,Sr,Ca)MgAl_{10}O_{17}$:Eu and $BaMgAl_{10}O_{17}$:Eu,Tb,Sm; Eu,Mn-activated aluminate phosphors such as $(Ba,Sr, Ca)MgAl_{10}O_{17}$:Eu,Mn; Eu-activated halophosphate phosphors such as $(Sr,Ca,Ba,Mg)_{10}(PO_4)_6Cl_2$:Eu and $(Ba,Sr,Ca)_5(PO_4)_3(Cl,F,Br,OH)$:Eu,Mn,Sb; Eu-activated silicate phosphors such as $BaAl_2Si_2O_8$:Eu and $(Sr,Ba)_3MgSi_2O_8$:Eu; Eu-activated phosphate phosphors such as $Sr_2P_2O_7$:Eu; sulfide phosphors such as ZnS:Ag and ZnS:Ag,Al; Ce-activated silicate phosphors such as $Y_2SiO_5$:Ce; tungstate phosphors such as $CaWO_4$; Eu,Mn-activated borate phosphate phosphors such as $(Ba,Sr,Ca)BPO_5$:Eu,Mn, $(Sr,Ca)_{10}(PO_4)_6.nB_2O_3$:Eu and $2SrO.0.84P_2O_5.0.16\ B_2O_3$:Eu; and Eu-activated halosilicate phosphors such as $Sr_2Si_3O_8.2SrCl_2$:Eu.

Alternatively, fluorescence dyes such as naphthalic imides, benzoxazoles, styryls, coumarins, pyrazolines and triazoles and organic phosphors such as thulium complexes may be used as a blue phosphor.

The above phosphors may be used alone or in arbitrary combination of two or more in an arbitrary ratio.

[1-2-4] Yellow Phosphor

A base phosphor generating yellow fluorescence (hereinafter, referred to as "yellow phosphor" as appropriate) includes the followings.

As a specific example, a fluorescence generated by a yellow phosphor suitably has a wavelength in the range of usually 530 nm or more, preferably 540 nm or more, more preferably 550 nm or more and usually 620 nm or less, preferably 600 nm or less, more preferably 580 nm or less.

If the wavelength of the major emission peak of the yellow phosphor is shorter than the range described above, the color rendering property of the illuminating device may be degraded due to decrease in yellow component, and in the case of the longer wavelength, the brightness in the illuminating device may be reduced.

Examples of such yellow phosphor may include various phosphors such as oxides, nitrides, oxynitrides, sulfides and oxysulfides.

Particularly, the examples include a garnet phosphor having a garnet structure represented by, for example, $RE_3M_5O_{12}$:Ce (where RE represents at least one element of Y, Tb, Gd, Lu and Sm and M represents at least one element of Al, Ga and Sc) and $M^2{}_3M^5{}_2M^4{}_3O_{12}$:Ce (where $M^2$, $M^3$ and $M^4$ represent a bivalent, a trivalent and a tetravalent metal elements, respectively); an orthosilicate phosphor represented by, for example, $AE_2M^5O_4$:Eu (where AE represents at least one element of Ba, Sr, Ca, Mg and Zn, and $M^5$ represents at least one element of Si and Ge); an oxynitride phosphor where oxygen as a constituent element of any of the above phosphors is partly replaced by nitrogen; and a Ce-activated phosphor including a nitride phosphor having a $CaAlSiN_3$ structure such as $AEAlSiN_3$:Ce (where AE represents at least one element of Ba, Sr, Ca, Mg and Zn).

Additional examples of yellow phosphor may include Eu-activated phosphors including sulfide phosphors such as $CaGa_2S_4$:Eu$(Ca,Sr)Ga_2S_4$:Eu and $(Ca,Sr)(Ga,Al)_2S_4$:Eu, and oxynitride phosphors having a SiAlON structure such as $Ca_x(Si,Al)_{12}(O,N)_{16}$:Eu.

The phosphors described in [1-2-1] to [1-2-4] may be appropriately combined, depending on desired emission spectrum, color temperature, trichromatic coordinate, color rendering properties and luminescent efficiency. Combining particular phosphors as appropriate may provide not only white color (daylight, neutral white, white, natural white and warm white) but also pastel and monochromatic light.

[1-2-5] Other Physical Properties of the Phosphor

A particle size of the phosphor used in the present invention is not particularly restricted, but the median diameter ($D_{50}$) is usually 0.1 μm or more, preferably 2 μm or more, more preferably 10 μm or more. Furthermore, it is usually 100 μm or less, preferably 50 μm or less, more preferably 20 μm or less.

If the median diameter ($D_{50}$) of the phosphor is within the above range, the light emitted from the semiconductor light-emitting element is sufficiently scattered. Since the light emitted from the semiconductor light-emitting element is sufficiently absorbed by phosphor particles, the conversion of wavelength is carried out with a high efficiency and the light emitted from the phosphor is omnidirectionaly irradiated. This allows the primary lights from a plurality of phosphors to be mixed to become white, and the uniform white light and illumination intensity is obtained as the composite light in the illuminating device according to the present invention because the uniform white color is obtained.

If the median diameter ($D_{50}$) of the phosphor is larger than the above range, the light emitted from the light-emitting element may not be sufficiently absorbed by the phosphor because the phosphor may not sufficiently fill the space of the luminescent part. If the median diameter ($D_{50}$) of the phosphor is smaller than the above range, the illumination intensity of the illuminating device according to the present invention may decrease, because the luminescent efficiency of the phosphor may be reduced.

A particle size distribution (QD) of phosphor particles is better for homogeneous dispersion of the particles in a phosphor-containing part described later, but a smaller size leads to reduction in a classification yield and thus to cost increase, and it is, therefore, usually 0.03 or more, preferably 0.05 or more, more preferably 0.07 or more. It is usually 0.4 or less, preferably 0.3 or less, more preferably 0.2 or less. The shape of the phosphor particle is not particularly restricted as long as it does not affect formation of a phosphor part.

In the present invention, the median diameter ($D_{50}$) and the particle size distribution (QD) of the phosphor can be obtained from a size distribution curve by weight. The size distribution curve by weight can be obtained by determining the size distribution using laser diffraction and scattering; specifically, it may be determined as described below.

A phosphor is dispersed in a solvent such as ethylene glycol under the environment of a temperature of 25° C. and a humidity of 70%.

The sample is measured by a laser diffraction type size distribution measuring apparatus (Horiba, Ltd., "LA-300") in a particle size range of 0.1 µm to 600 µm.

In this size distribution curve by weight, a particle size value at an integration value of 50% is represented as the median diameter $D_{50}$. Particle size values at integration values of 25% and 75% are represented as $D_{25}$ and $D_{75}$, respectively, and QD is defined as $QD=(D_{75}-D_{25})/(D_{75}+D_{25})$. A smaller QD means a narrower size distribution.

[1-2-6] Surface Processing of the Phosphor

The phosphor used in the present invention may be surface-processed for improving water resistance or for preventing undesired phosphor aggregation in a phosphor-containing part described later.

Examples of such surface processing include surface processing using, for example, an organic, inorganic or glass material as described in JPA 2002-223008, coating with a metal phosphate as described in JPA 2000-96045, coating with a metal oxide, and known surface processing with, for example, a silica coating agent.

Specifically, for example, the surface of the phosphor can be coated with the above metal phosphate by the following procedure.

(1) A predetermined amount of a water-soluble phosphate such as potassium phosphate and sodium phosphate and a water-soluble metal salt compound of at least one of an alkaline-earth metal such as calcium chloride, strontium sulfate, manganese chloride and zinc nitride, Zn and Mn is added to a phosphor suspension and the mixture is stirred.

(2) A phosphate of at least one metal of an alkaline-earth metal, Zn and Mn is generated in the suspension and the generated metal phosphate is deposited on the surface of the phosphor.

(3) Water is removed.

Silica coating can be conducted by precipitating $SiO_2$ by neutralizing a liquid glass or by surface-processing with a hydrolyzed alkoxysilane (for example, JPA 3-231987), preferably by surface-processing with a hydrolyzed alkoxysilane in the light of improving dispersibility.

[1-2-7] Amount of the Phosphor

The amount of such phosphor used in the illuminating device according to the present invention can be appropriately selected to meet the requirements for the properties of the illuminating device according to the present invention, and is preferably 5 to 90% by weight to the sum of the total weight of the phosphor, a weight of, for example, a transparent resin as a sealing material described later and a weight of an additive such as a viscosity modifier added as necessary. When the phosphor is used in a transmissive type, the rate is preferably as low as 5 to 50% by weight, while when it is used in a reflective type, the rate is preferably as large as 50 to 90% by weight.

[1-3] Sealing Material

The luminescence source used in the illuminating device according to the present invention may essentially have the above solid light-emitting element and the phosphor, and the other components are not particularly restricted. The solid light-emitting element and the phosphor are usually disposed such that a light generated from the solid light-emitting element excites the phosphor to emit a light, which can be taken out. For such a structure, the solid light-emitting element and the phosphor are usually protected by sealing with a sealing material. Specifically, this sealing material is utilized for constituting a light-emitting part by containing the above phosphor in dispersed or for bonding the light-emitting element, the phosphor and a substrate.

The sealing material to be used may usually includes thermoplastic resin, thermosetting resin and photocurable resin, and a preferable resin is adequately durable and transparent to an excitation light (peak wavelength: 350 nm to 430 nm) from the solid light-emitting element.

Specifically, the sealing material includes (meth)acrylic resin such as methyl poly(meth)acrylate; styrene resin such as polystyrene and styrene-acrylonitrile copolymers; polycarbonate resin; polyester resin; phenoxy resin; butyral resin; polyvinyl alcohol; cellulose resin such as ethyl cellulose, cellulose acetate and cellulose acetate butyrate; epoxy resin; phenol resin; and silicone resin. Other material may be used, including inorganic material such as an inorganic material produced by solidifying a metal alkoxide, a ceramic precursor polymer or a solution prepared by hydrolytic polymerization of a solution containing a metal alkoxide by a sol-gel process or combination of these; for example, an inorganic material containing a siloxane bond or a glass.

Among them, preferred are a silicone resin and an inorganic material produced by solidifying a metal alkoxide, a ceramic precursor polymer or a solution prepared by hydrolytic polymerization of a solution containing a metal alkoxide by a sol-gel process or combination of these; for example, an inorganic material containing a siloxane bond.

Among these sealing materials, the silicone-based materials and silicone resin (hereinafter, referred to as "silicone-based material according to the present invention" in some instances) having features (1) to (3) below are particularly preferable.

(1) In a solid Si-nuclear magnetic resonance spectrum, it has at least one peak of (i) and/or (ii) described below.

(i) Peaks whose peak top position is in an area of a chemical shift of −40 ppm or more and 0 ppm or less, and whose full width at half maximum is 0.3 ppm or more and 3.0 ppm or less.

(ii) Peaks whose peak top position is in an area of the chemical shift of −80 ppm or more and less than −40 ppm, and whose full width at half maximum is 0.3 ppm or more and 5.0 ppm or less.

(2) Silicon content is 20% by weight or more.

(3) Silanol content is 0.01% by weight or more and 10% by weight or less.

In the present invention, the silicone-based material and silicone resin having feature (2) in features (1) to (3) are preferable. More preferred are the silicone-based material and silicone resin having features (1) and (2). Particularly preferred are the silicone-based material and silicone resin having features (1) to (3).

These features (1) to (3) will be described below.

[1-3-1] Solid Si-NMR Spectrum

A compound having silicon as its main component is represented by a rational formula of $SiO_2 \cdot nH_2O$ and has a structure in which an oxygen atom O is bound to each vertex of a tetrahedron of a silicon atom Si and further a silicon atom Si is bound to each of these oxygen atoms O to spread like a network. Pattern views (A) and (B) shown below represent a network structure of Si—O without showing the above tetrahedron structure and part of oxygen atoms O is substituted by other components (for example, —H and —$CH_3$) in a repetitive unit of Si—O—Si—O—. If focused on one silicon atom Si, there is a silicon atom Si ($Q^4$) having four —OSi as shown in the pattern view (A), a silicon atom Si ($Q^3$) having three —OSi as shown in the pattern view (B) and the like. Then, in solid Si-NMR measurement, peaks based on each of the above silicon atoms Si are in order called a $Q^4$ peak, $Q^3$ peak, and so on.

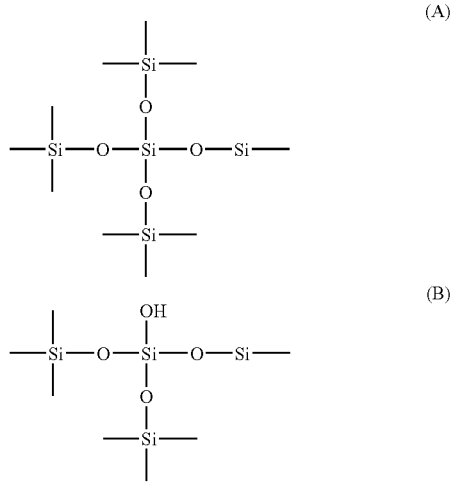

A silicon atom with these four bound oxygen atoms are generically called a Q site. In the present invention, each peak of $Q^0$ to $Q^4$ originating from a Q site will be called a $Q''$ peak group. A $Q''$ peak group of a silica membrane containing no organic substituent is usually observed as a continuous polymodal peak in an area of a chemical shift of −80 to −130 ppm.

In contrast, a silicon atom having three bound oxygen atoms and one other bound atom (normally a carbon atom) is generically called a T site. Like a peak originating from a Q site, a peak originating from a T site is observed as each peak of $T^0$ to $T^3$. In the present invention, each peak originating from a T site will be called a $T''$ peak group. A $T''$ peak group is generally observed as a continuous polymodal peak in an area on a higher magnetic field side (usually the chemical shift of −80 to −40 ppm) than a $Q''$ peak group.

Further, a silicon atom with two bound oxygen atoms and two other bound atoms (normally carbon atoms) is generically called a D site. Like a peak group originating from a Q site or T site, a peak originating from a D site is observed as each peak ($D''$ peak group) of $D^0$ to $D''$ in a still higher magnetic field area (usually an area of the chemical shift of 0 to −40 ppm) than a $Q''$ and $T''$ peak groups to be observed as a polymodal peak. Each peak group of $D''$, $T''$, and $Q''$ has an area proportional to a molar ratio of silicon atoms placed in an environment corresponding to each peak group and therefore, if the area of all peaks is set to a molar quantity of all silicon atoms, a total area of the $D''$ peak group and $T''$ peak group will usually correspond to a molar quantity of all silicon atoms directly bound to corresponding carbon atoms.

If the solid Si—NMR spectrum of the silicone-based material according to the present invention is measured, the $D''$ peak group and $T''$ peak group originating from silicon atoms directly bound to carbon atoms of an organic group and the $Q''$ peak group originating from silicon atoms not bound to carbon atoms of the organic group each appear in different areas. Among these peaks, peaks of less than −80 ppm correspond to the $Q''$ peak, as described above, and peaks of −80 ppm or more correspond to the $D''$ and $T''$ peaks. Although the $Q''$ peak is not essential for the silicone-based material according to the present invention, at least one and preferably a plurality of peaks are observed in the $D''$ and $T''$ peak areas.

The silicone-based material according to the present invention is characterized in that the full width at half maximum of peak measured in an area of −80 ppm or more is smaller (narrower) than the range of a full width at half maximum of the silicone-based materials conventionally known by the sol gel method.

Summarizing in terms of chemical shifts, in the silicone-based material according to the present invention, the full width at half maximum of the $T''$ peak group whose peak top position is observed in an area of the chemical shift of −80 ppm or more and less than −40 ppm is in the range of usually 5.0 ppm or less, preferably 4.0 ppm or less, and usually 0.3 ppm or more, preferably 0.4 ppm or more.

Similarly, the full width at half maximum of the $D''$ peak group whose peak top position is observed in an area of the chemical shift of −40 ppm or more and 0 ppm or less is generally smaller than that of the $T''$ peak group due to smaller constraints of molecular motion and is in the range of usually 3.0 ppm or less, preferably 2.0 ppm or less, and usually 0.3 ppm or more.

If the full width at half maximum of peaks observed in the above chemical shift areas is larger than the above ranges, a state in which constraints of molecular motion is large and thus distortion is large is created, leading to possibly of likely creation of more cracks and a member inferior in heat resistance and weather resistance. When, for example, a lot of tetrafunctional silane is used or large internal stress is generated by drying rapidly in a drying process, the range of the full width at half maximum will be larger than the above range.

If the full width at half maximum of peaks is smaller than the above ranges, Si atoms in its environment are not involved in siloxane crosslinking and, for example, trifunctional silane remains in a non-crosslinked state, leading possibly to a member inferior in heat resistance and weather resistance to materials formed mainly of siloxane bonds.

A composition of the silicone-based material according to the present invention is limited to that whereby a crosslink in the system is mainly formed by an inorganic component such as silica. In other words, a silicone-based material where a small amount of an Si component is contained in a large amount of an organic component cannot provide satisfactory heat resistance, light resistance or application performance even when the peak having the full width at half maximum in the above range is observed in −80 ppm or more.

The value of chemical shift for the silicone-based material according to the present invention can be calculated, for example, based on a measurement result of solid Si—NMR measurement made according to the following method. Also, measured data is analyzed (the full width at half maximum, silanol amount and so on) by a method in which each peak is divided and extracted by waveform separation analysis or the like utilizing, for example, the Gauss function or Lorentz function.

{Solid Si—NMR Spectrum Measurement}

When measuring a solid Si—NMR spectrum of the silicone-based material, solid Si—NMR spectrum measurement and waveform separation analysis are performed under the following conditions. The full width at half maximum of each peak is determined for the silicone-based material from resultant waveform data.

<Instrument Conditions>

Instrument: Infinity CMX-400 nuclear magnetic resonance spectroscope manufactured by Chemagnetics Co.

$^{29}Si$ resonance frequency: 79.436 MHz

Probe: 7.5 mm φCP/MAS probe

Temperature: Room temperature

Rotational frequency of sample: 4 kHz

Measuring method: Single pulse method
$^1$H decoupling frequency: 50 kHz
$^{29}$Si flip angle: 90°
$^{29}$Si 90° pulse width: 5.0 μs
Repetition time: 600 s
Number of count: 128 times
Observation width: 30 kHz
Broadening factor: 20 Hz <Method of Data Processing>

For the silicone-based material, 512 points are taken in as measured data and zero-filled to 8192 points before Fourier transformation is performed.

<Method of Waveform Separation Analysis>

For each peak after Fourier transformation, an optimization calculation is performed by the nonlinear least square method using the center position, height, and full width at half maximum of a peak shape created by a Lorentz waveform, Gauss waveform, or a mixture of both as variable parameters.

For identification of a peak, refer to AIChE Journal, 44(5), p. 1141, 1998 or the like.

[1-3-2] Silicon Content

The silicone-based material according to the present invention has the silicon content of at least 20% by weight (feature (2)). The basic skeleton of a conventional silicone-based material is an organic resin such as an epoxy resin with carbon-carbon and carbon-oxygen bonds as a basic skeleton. In contrast, the basic skeleton of the silicone-based material according to the present invention is an inorganic siloxane bond like glass (silicate glass). As is evident from a chemical bond comparison table in Table 1 shown below, the siloxane bond has the following superior features as the silicone-based material.

(I) Light resistance is superior with large bond energy and properties resistant to pyrolysis and photolysis.
(II) Electrically polarized slightly.
(III) The chain structure has a high degree of freedom so that highly flexible structures can be formed and are freely rotatable about a siloxane chain.
(IV) Highly oxidized so that further oxidization is impossible.
(V) High electrical insulating properties.

TABLE 1

| Comparative table for chemical bond | | | |
|---|---|---|---|
| Bond | Bond distance (Å) | Bond energy (kcal/mol) | Bond angle (°) |
| Si—O—Si | 1.64 | 108 | 130 to 160 |
| C—O—C | 1.43 | 86 | 110 |
| C—C—C | 1.54 | 85 | 109 |

From these features, it is understood that a silicone-based material formed by a skeleton in which the siloxane bond is formed three-dimensionally with a high degree of crosslinking can become a protective film similar to minerals such as glass and rock and high in heat resistance and light resistance. Particularly, the silicone-based material with a methyl group as a substituent is superior in light resistance for lack of absorption in an ultraviolet region and photolysis is unlikely to occur.

The silicon content of the silicone-based material according to the present invention is 20% by weight or more, as described above, but among others 25% by weight or more is preferable and 30% by weight or more is still preferable. On the other hand, an upper limit is usually set to 47% by weight due to a fact that the silicon content of glass consisting entirely of $SiO_2$ is 47% by weight.

The silicon content of the silicone-based material can be calculated from an analysis result after performing inductively coupled plasma spectrometry (hereinafter arbitrarily abbreviated as "ICP") analysis using, for example, a method described below.

{Silicon Content Measurement}

A singly cured body of the silicone-based material is ground to pieces of about 100 μm and kept in a platinum crucible in the air at 450° C. for 1 hour and then at 750° C. for 1 hour and at 950° C. for 1.5 hours for burning. After removal of carbon components, a small amount of the resultant residual is added a 10-fold amount or more of sodium carbonate, heated by a burner to melt, then cooled to add desalted water and further diluted to several ppm in silicon while adjusting pH value to around neutrality using hydrochloric acid before performing ICP analysis.

[1-3-3] Silanol Content

The silicone-based material according to the present invention has the silanol content in the range of usually 0.01% by weight or more, preferably 0.1% by weight or more, still preferably 0.3% by weight or more, and usually 10% by weight or less, preferably 8% by weight or less, and still preferably 5% by weight or less (feature (3)).

The silicone-based material according to the present invention varies little over time due to low silanol content, is superior in long-term capability stability, and has superior capabilities of low hygroscopicity and moisture permeability. However, if a member does not contain silanol at all, the member has poor adhesion and therefore, the appropriate range of the silanol content described above exists.

The silanol content of the silicone-based material can be calculated by making solid Si—NMR spectrum measurement using, for example, the method above described {Solid Si—NMR spectrum measurement}, determining a ratio (%) of silicon atoms in silanol to all silicon atoms from the ratio of peak areas originating from silanol to all peak areas, and comparing with a silicon content analyzed separately.

The silicone-based material according to the present invention contains a proper amount of silanol, so that silanol forms hydrogen bonding with a polar moiety present in the device surface, resulting in adhesiveness. The polar moiety includes, for example, oxygen in a hydroxy group or a metalloxane bond.

The silicone-based material according to the present invention can be heated in the presence of a proper catalyst to form a covalent bond with a hydroxy group in a device surface by dehydration, resulting in further strong adhesiveness.

On the other hand, an excessive amount of silanol may lead to difficulty in application due to thickening of the system or a crack due to foam formation and increasing an internal stress caused by solidification before evaporation of low-boiling components by heating because of excessive activity.

[1-3-4] Hardness Measurement

The silicone-based material according to the present invention has preferably elastomeric properties. Specifically, it has feature (4) described below.

(4) The hardness measurement (Shore A) by durometer type A is usually 5 or more, preferably 7 or more, more preferably 10 or more and usually 90 or less, preferably 80 or less, more preferably 70 or less.

With the hardness measurement in the above range being provided, advantages of being more resistant to cracks and superior in reflow resistance and temperature cycle resistance can be obtained. Reflow is a soldering process where a solder paste is printed on a substrate, on which a component is placed and bonded by heating. Thus, reflow resistance means ability of tolerating thermal shock at the highest temperature of 260° C. for 10 sec.

The above hardness measurement (Shore A) can be measured according to a method described in JISK6253. More specifically, the measurement can be made using an Type A rubber hardness scale manufactured by Kori Seiki Mfg. Co., Ltd.

[1-3-5] Other Additives

The silicone-based material according to the present invention as a sealing material can contain a metal element which can give a metal oxide having a higher refractive index in order to adjust a refractive index of the sealing material. Examples of a metal element which can give a metal oxide having a higher refractive index include Si, Al, Zr, Ti, Y, Nb and B. These metal elements can be used alone or in arbitrary combination of two or more in an arbitrary ratio.

Such a metal element may be in any state as long as it does not deteriorate transparency in a sealing material; for example, it may form a homogeneous glass layer as a metalloxane bond or exist as particles in a sealing material. When being in a particulate state, its internal structure may be amorphous or crystalline, and for providing a higher refractive index, the structure is preferably crystalline. For preventing transparency deterioration, a particle size is generally an emission wavelength of a semiconductor light-emitting element or less, preferably 100 nm or less, more preferably 50 nm or less, particularly preferably 30 nm or less. For example, the silicone material may contain particles of, for example, silicon oxide, aluminum oxide, zirconium oxide, titanium oxide, yttrium oxide and niobium oxide, to make the above metal element present in a particulate state in the sealing material.

A silicone material of the present invention may further contain a known additive such as a diffusing agent, a filler, a viscosity modifier and an ultraviolet absorber.

Specific examples of a silicone material of the present invention may include those described in Japanese Patent Application No. 2006-176468.

[1-4] Other Components

A luminescence source used in an illuminating device of the present invention may, in addition to the above components, contain any of additives known in the art as an optional component, including dyes, antioxidants, stabilizers (processing stabilizers such as phosphorous-containing processing stabilizer, oxidation stabilizers, thermal stabilizers, and light-resistance stabilizers such as ultraviolet absorber), silane coupling agents, light diffusing agents and fillers.

[1-5] Structure of the Luminescence Source

The luminescence source used in the illuminating device according to the present invention may have any specific structure as long as it contains the above light-emitting element and the phosphor, but for example, it is desirable to use an LED as the solid light-emitting element.

There will be detailed examples of embodiments of the luminescence source using the LED, but the present invention is not limited to the following description and can vary within its scope.

[1-5-1] Embodiment 1

FIG. 1 schematically shows a configuration of an LED lamp according to one embodiment of the present invention.

LED lamp 1 according to this embodiment contains frame 2, LED 3 as a light-emitting element and phosphor-containing part 4 which partly absorbs a light emitted from LED 3 and emits a light with a different wavelength.

Frame 2 is a metal base for holding LED 3 and phosphor-containing part 4. Frame 2 has a pair of conductive members 2B, 2C, and in the upper surface of one conductive member 2B, there is formed concave (recess) 2A opening upward in FIG. 1 with a trapezoidal cross section.

LED 3 is placed in the bottom of concave 2A as the light-emitting element. LED 3 emits a light in the region of near-ultraviolet to blue while being supplied with electric power and may be as described in [1-1]. Furthermore, in concave 2A, LED 3 is covered with phosphor-containing part 4 which partly absorbs the light emitted from LED 3 and emits a light with a different wavelength. The light emitted from LED 3 is partly absorbed by a light-emitting material (phosphor) within phosphor-containing part 4 as an excitation light and partly passes through phosphor-containing part 4 to be emitted from LED lamp 1.

LED 3 can be placed in concave 2A by any method. In this embodiment, LED 3 is placed on concave 2A by adhering with adhesive 5.

LED 3 placed on concave 2A is electrically connected to frame 2. LED 3 is supplied with electric energy via frame 2 to emit the light. LED 3 can be electrically connected to frame 2 by any appropriate method, depending on electrode arrangement (not shown) in LED 3. For example, when a pair of electrodes are formed in one side of LED 3, frame 2 and LED 3 are electrically connected by placing LED 3 such that the side having the electrodes faces upward and connecting the electrodes in each pair with conductive members 2B, 2C via, for example, gold wire 6 as shown in FIG. 1. When a pair of electrodes are formed in two sides facing each other in LED 3, LED 3 is placed on concave 2A via a conductive paste such that one electrode faces downward while the other electrode is connected with conductive member 2C via, for example, a gold wire to form electric connection between frame 2 and LED 3.

Phosphor-containing part 4 has a configuration containing a transparent resin and a phosphor. The phosphor is a substance which is excited by the light emitted from LED 3 to emit a light having a different wavelength. Phosphor-containing part 4 may be constituted by one phosphor or a mixture of two or more. In any case, the types of the phosphors may be selected such that the sum of a light emitted from LED 3 and the light emitted by the phosphors contained in, phosphor-containing part 4 gives a desired color. The transparent resin not only transmits the light emitted from LED 3 and the phosphor, but also has a function of sealing LED 3 and dispersing and holding the phosphors. Any material can be used as the transparent resin as long as it has such a function, and herein the above sealing materials are used.

From LED lamp 1, a part of the light emitted from LED 3 and the light emitted from the phosphors contained in phosphor-containing part 4 are emitted. As described above, LED 3 and phosphor-containing part 4 are formed in the cup-shaped concave 2A, so that the light emitted from LED lamp 1 can be made directional and thus the emitted light can be effectively utilized.

LED 3 and phosphor-containing part 4 can be, if necessary, protected by molded part 7. By forming molded part 7 in a predetermined shape, molded part 7 can have a function as a lens for controlling light distribution properties (light distribution controlling element). In this embodiment, molded part 7 is formed in a bombshell-shape to have a lens function. Molded part 7 can be made of a transparent resin. Examples of a resin used for molded part 7 include epoxy resins, urethane resins and silicone resins, among which epoxy resins are particularly preferable. The resin constituting molded part 7 may contain, if necessary, additives such as a viscosity modifier, a diffusing agent and an ultraviolet absorber.

As described above, a plurality of LED lamps 1 as the luminescence source having LED 3 and phosphor-containing part 4 are integrated on, for example, a substrate to give a light-emitting part according to the present invention. When each luminescence source does not have molded part 7, all of the luminescence sources may be protected by the molded part in whole after a plurality of luminescence sources are integrated.

[1-5-2] Embodiment 2

Although Embodiment 1 illustrates an example of constituting the solid light-emitting element and the phosphor as a single module by sealing LED 3 by phosphor-containing part 4, the solid light-emitting element and the phosphor may be constituted as separate modules. There will be described a luminescence source of Embodiment 2 where a solid light-emitting element and a phosphor are constituted.

Figure 2A:
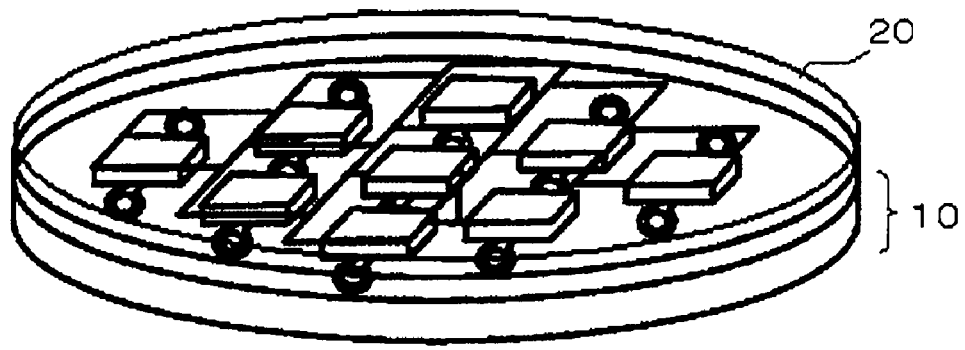
FIG. 2A is a schematic perspective view of Embodiment 2 of luminescence sources according to the present invention.
Figure 2B:
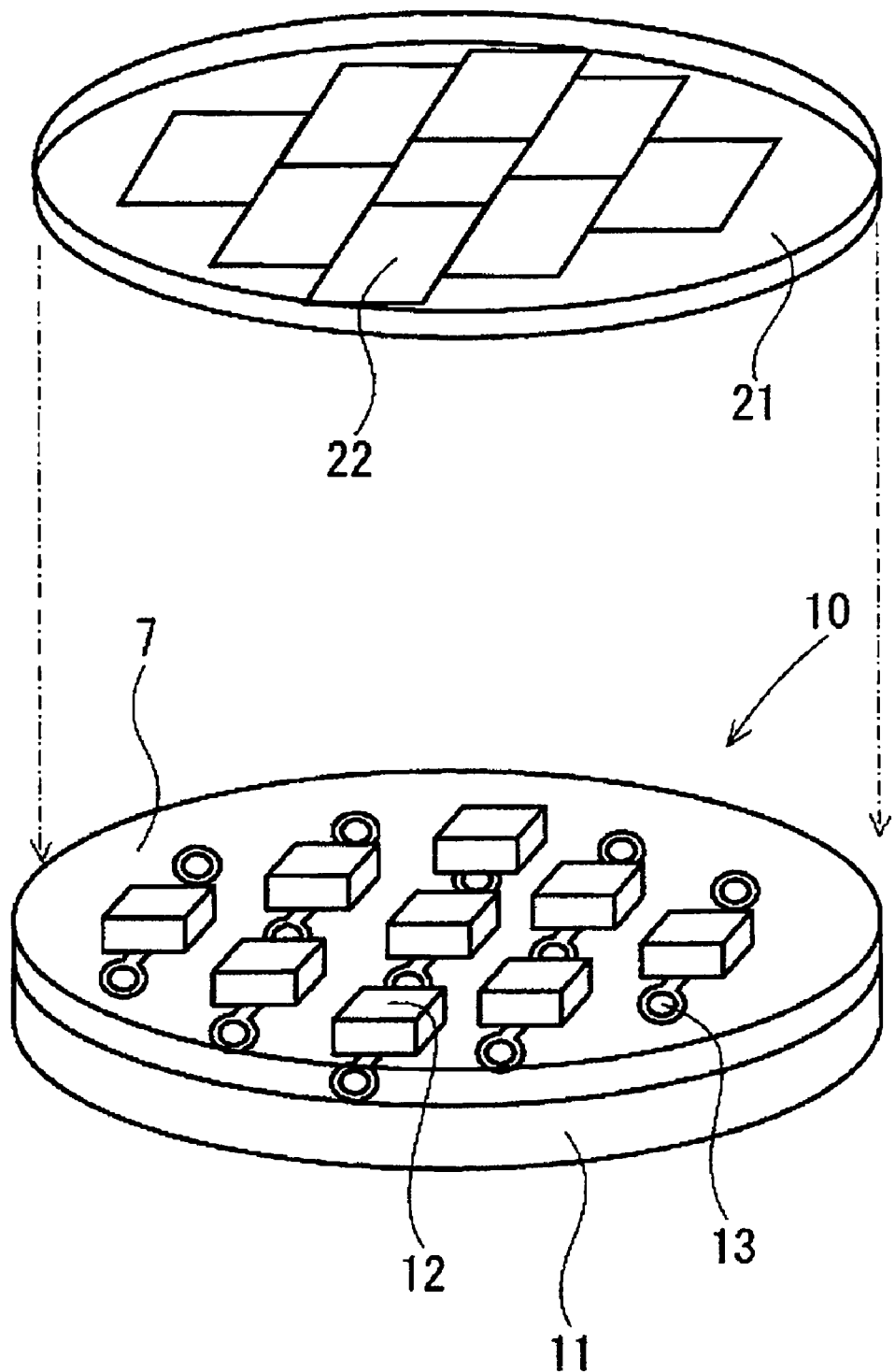
FIG. 2B is an exploded perspective view of the luminescence sources shown in FIG. 2A.

The luminescence source shown in FIG. 2A has solid light-emitting element module 10 which is a solid light-emitting element formed as a module and phosphor module 20 which is a phosphor-containing part formed as a module. As shown in FIG. 2B, phosphor module 20 is joined to solid light-emitting element module 10 to provide the luminescence source. There will be described each module.

[1-5-2-1] Solid Light-Emitting Element Module

As shown in FIG. 2B, solid light-emitting element module 10 has base 11 and solid light-emitting element 12 disposed on base 11.

(i) Base

Base 11 in solid light-emitting element module 10 fixes and holds solid light-emitting element 12. Although FIG. 2B shows the disk-shaped base 11, base 11 may be formed with any material, shape or dimension if it can tolerate under the conditions of use as a base for a solid light-emitting element module of this embodiment such as a temperature condition as long as the effects of this embodiment are not significantly deteriorated. In the surface of base 11 in which solid light-emitting element 12 is formed, molded part 7 may be formed such that it covers the whole surface of base 11 to seal solid light-emitting element 12. A resin forming molded part 7 may be the resin used in Embodiment 1.

(ii) Solid Light-Emitting Element

Solid light-emitting element 12 may be that described for emitting a primary light from the luminescence source, particularly preferably the LED. Therefore, as shown in FIG. 2B, when solid light-emitting element 12 and phosphor-containing part 22 are used to emit a primary light, solid light-emitting element module 10 should have at least one solid light-emitting element 12. Here, solid light-emitting element 12 may be shared by two or more phosphor parts 22.

The number of solid light-emitting element 12 may be one or a plural number, depending on, for example, the size of base 11. In this embodiment, there are disposed a plurality of, specifically nine solid light-emitting elements 12 on base 11.

(iii) Other Members

Solid light-emitting element module 10 may have members other than base 11 and solid light-emitting element 12. For example, solid light-emitting element module 10 may have wiring 13 for supplying electric power to solid light-emitting element 12. In general, this wiring 13 is formed in base 11 in solid light-emitting element module 10. When there are a plurality of solid light-emitting elements 12 in base 11, wiring 13 is formed such that it can supply electric power to each solid light-emitting element 12.

[1-5-2-2] Phosphor Module

As shown in FIG. 2B, phosphor module 20 is joined to the upper surface of solid light-emitting element module 10, to form a luminescence source of this embodiment in combination with solid light-emitting element module 10 and, if necessary, other members, and has base 21 and phosphor-containing part 22 disposed on the base 21. For effectively utilizing a light from solid light-emitting element module 10, it is preferable that phosphor module 20 is in close contact with solid light-emitting element module 10, but depending on a surface material of solid light-emitting element module 10 and a transparent resin material in phosphor module 20, there may be a space between phosphor module 20 and solid light-emitting element module 10.

(i) Base

Base 21 in phosphor module 20 is a support for phosphor-containing part 22 and may be, for example, a transparent film or plate (sheet).

Base 21 in phosphor module 20 may be formed with any material, shape or dimension if it can tolerate under the conditions of use as a base for a phosphor module of this embodiment such as a temperature condition as long as the effects of this embodiment are not significantly deteriorated.

(ii) Phosphor-Containing Part

Phosphor-containing part 22 is formed in a certain area of base 21, and, as in phosphor-containing part 4 described in Embodiment 1, has a transparent resin and a phosphor dispersed in the transparent resin. Phosphor-containing part 22 may be as described for phosphor-containing part 4.

Phosphor-containing part 22 is usually formed in the surface of base 21, but when the transparent resin for phosphor-containing part 22 is identical to the material forming base 21, a phosphor can be contained in a certain area of base 21 to provide phosphor-containing part 22.

When phosphor-containing part 22 is formed in the surface of base 21, phosphor-containing part 22 can be formed in base 21 by, for example, preparing a dispersion of a phosphor in a transparent resin (binder resin) and then pattern-applying it to the surface of base 21.

Specific examples of a method for pattern-applying phosphor-containing part 22 to base 21 include printing processes such as screen printing, gravure printing, flexo printing and inkjet printing and a method where a photosensitive resist is used as the transparent resin, the phosphor is dispersed in it to prepare a dispersion, the dispersion is applied to the surface of base 21, then it is exposed via a mask, and an unexposed part is removed by development for patterning. Of course, in addition to these methods, for example, an arbitrary patterning method used for preparing a color filter may be used as a method for forming phosphor-containing part 22 in whole, and furthermore, transfer molding or injection molding may be used, depending on a selected transparent resin. Alternatively, as a method for forming phosphor-containing part 22 only in a required part, a method using a common dispenser may be employed.

In terms of a position of phosphor-containing part 22, phosphor-containing part 22 is disposed facing solid light-emitting element 12 such that a light emitted from solid light-emitting element 12 in solid light-emitting element module 10 can be received by phosphor-containing part 22.

The number of phosphor-containing part 22 may be one or a plural number, depending on, for example, the size of base 21. In this embodiment, nine phosphor-containing parts 22 are disposed, corresponding to the number of solid light-emitting elements 12.

(iii) Other Members

Phosphor module 20 may have members other than base 21 and phosphor-containing part 22.

Phosphor module 20 thus formed is combination with solid light-emitting element module 10 and phosphor-containing part 22 receives a light emitted from solid light-emitting element 12 in solid light-emitting element module 10 (excitation light). The light from solid light-emitting element 12 is received by phosphor-containing part 22 to excite the phosphor in phosphor-containing part 22, resulting in emission of fluorescence (that is, primary light).

[2] Light-Emitting Part

The illuminating device according to the present invention has a light-emitting part where the above luminescence sources are integrated. The light-emitting part has a plurality of luminescence sources such that primary lights emitted from the luminescence sources are mixed at a certain distance from the light-emitting surface of the light-emitting part.

As described in Embodiment 2, when each of solid light-emitting element module 10 and phosphor module 20 has a plurality of solid light-emitting elements 12 and phosphor-containing parts 22, the whole configuration shown in FIG. 2A may be used as the luminescence source and a plurality of these may be integrated to form the light-emitting part, or each pair of solid light-emitting element 12 and phosphor-containing part 22 may be used as the luminescence source and the whole configuration shown in FIG. 2A may be used as the light-emitting part. In the latter case, a plurality of phosphor are used as the phosphor contained in each phosphor-containing part 22 such that a plurality of primary light having different wavelength are emitted.

In terms of the light-emitting part, there will be detailed the light-emitting part using a plurality of bomb-shaped LED lamps (hereinafter, simply referred to as "bomb-shaped LED") as described in Embodiment 1.

[2-1] Arrangement of Luminescence Sources

When the illuminating device according to the present invention is constituted by integrating a plurality of bomb-shaped LEDs having different emission colors, the number and the positions of the integrated bomb-shaped LEDs can be appropriately selected, depending on the size of the designed illuminating device and a required, as described later.

Figure 3:
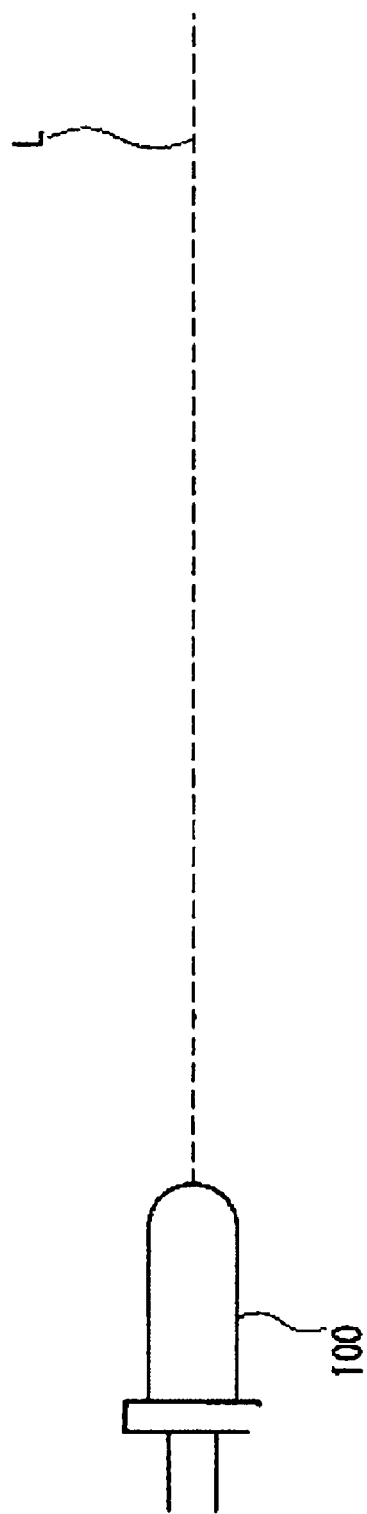
FIG. 3 is an explanation drawing illustrating a structure axis of an LED.

When the structure axes (or optical axes) L (shown in FIG. 3) of the plurality of the integrated bomb-shaped LEDs are mutually non-parallel, the illumination intensity cannot be uniform in an illuminated surface receiving a composite light from the plurality of bomb-shaped LEDs. In particular, when a distance between the LEDs is large, an even illumination intensity cannot be obtained. Thus, when the light-emitting part is formed by mounting a plurality of bomb-shaped LEDs on an interconnection substrate, it is preferable that the structure axes (or optical axes)L of bomb-shaped LEDs 100 are perpendicularly arranged to the surface of the interconnection substrate. It is also applied to an LED chip in which the solid light-emitting element is surface-mounted.

When the solid light-emitting element is the bomb-shaped LED or surface-mounted LED chip as described above, the light-emitting surface in the light-emitting part in the present invention contains an end in the light-outgoing side of the luminescence source and is parallel to the interconnection substrate where solid light-emitting elements are integrated. For the luminescence source and the light-emitting part as the module as described in Embodiment 2, the light-outgoing side of the phosphor module is the light-emitting surface.

[2-2] Combination of Luminescence Sources

The illuminating device according to the present invention has a plurality of luminescence sources described above.

A plurality of luminescence sources emit lights having two or more different wavelengths (primary lights). These primary lights having two or more different wavelengths can be mixed to obtain a composite light.

In a conventional white light-emitting device in which an LED is combined with one or more color phosphors, formulation for creating a desired color (target color) is complicated and may be sometimes technically difficult due to package dependency, that is, variation in an LED wavelength, variation in dispersion of phosphors and the size or the shape of the package. The present invention where the light-emitting part is formed by integrating a plurality of luminescence sources is technically very significant in that a desired color can be obtained just by controlling primary lights generated individual luminescence sources.

The primary lights are usually two or more, preferably three or more. For creating a target color, the primary lights are multiple and it thus allows for reproducing a target color having a wide range spectrum from near ultra violet light to far-red light including illuminating light sources such as daylight color to neutral white color to white to natural white color to warm white color, CIE standard lights (A, B, C and D65) and sunlight (natural light) spectra.

Specific examples of the primary light combination may includes the followings.

Examples of Two-Color Mixing

Preferable combinations of emission peak wavelengths include 400 nm to 490 nm (blue) and 560 nm to 590 nm (yellow); and 480 nm to 500 nm (blue green) and 580 nm to 700 nm (red), particularly 400 nm to 490 nm (blue) and 560 nm to 590 nm (yellow).

Examples of Three-Color Mixing

Preferable combinations of emission peak wavelengths include 430 nm to 500 nm, 500 nm to 580 nm and 580 nm to 700 nm; 430 nm to 480 nm, 480 nm to 500 nm and 580 nm to 700 nm; and 430 nm to 500 nm, 560 nm to 590 nm and 590 nm to 700 nm. Particularly preferred is a combination of 430 nm to 500 nm, 500 nm to 580 nm and 580 nm to 700 nm.

Examples of Four-Color Mixing

Preferable combinations of emission peak wavelengths include 430 nm to 500 nm, 500 nm to 580 nm, 580 nm to 620 nm and 620 nm to 700 nm; 430 nm to 480 nm, 480 nm to 500 nm, 500 nm to 580 nm and 580 nm to 700 nm; and 430 nm to 480 nm, 480 nm to 500 nm, 560 nm to 590 nm and 590 nm to 700 nm. Particularly preferred is a combination of 400 nm to 490 nm, 490 nm to 580 nm, 580 nm to 620 nm and 620 nm to 700 nm.

Examples of Five-Color Mixing

Preferable combination of emission peak wavelengths include 430 nm to 480 nm, 480 nm to 500 nm, 500 nm to 580 nm, 580 nm to 620 nm and 620 nm to 700 nm.

[2-3] Energy Ratio of Light-Outgoing Parts in the Luminescence Source

The illuminating device according to the present invention can create the composite light having a desired color by emitting primary lights having two or more different wavelengths from a plurality of luminescence sources and mixing these primary lights as described in [2-2]. Here, when creating the composite light containing a combination of three primary lights having emission peak wavelengths in first to third different wavelength ranges described below, it is preferable that an energy ratio of light-outgoing parts in the luminescence sources is $E_1:E_2:E_3=5$ to 90:5 to 90:5 to 90 where $E_1$ is an energy of a primary light having an emission peak wavelength in the first wavelength range, $E_2$ is an energy of a primary light having an emission peak wavelength in the second wavelength range and $E_3$ is an energy of a primary light having an emission peak wavelength in the third wavelength range. Combination with such an energy ratio allows for finer white light mixing.

First wavelength range: 430 nm or more and less than 500 nm (hereinafter, this wavelength range may be sometimes referred to as "Rb")

Second wavelength range: 500 nm or more and less than 580 nm (hereinafter, this wavelength range may be sometimes referred to as "Rg".)

Third wavelength range: 580 nm or more and 700 nm or less (hereinafter, this wavelength range may be sometimes referred to as "Rr".)

For more effectively creating the composite light by mixing primary lights, an area of the light-outgoing part in the luminescence sources is preferably within the range of 0.1 mm$^2$ to 100 mm$^2$.

The energy ratio $E_1:E_2:E_3$ is preferably 5 to 90:5 to 90:5 to 90, more preferably 10 to 80:10 to 80:10 to 80. The energy ratio $E_1:E_2:E_3$ beyond the range may lead to an inadequate light intensity, a lower energy efficiency, difficulty in obtaining a desired spectrum or color temperature and/or poor color rendering properties.

As used herein, the term, "an energy of a light-outgoing part in a luminescence source" refers to an energy amount indicating a light emitted from a luminescence source having each wavelength. Examples of a factor determining the energy amount include an area of the light-emitting part in the luminescence source, a light-outgoing time of the luminescence source, a driving current for the luminescence source and electrical energy (driving current×voltage) of the luminescence source.

For example, the phrase, "an energy in a light-outgoing part in a luminescence source in a Rb wavelength" means, when there are a plurality of luminescence sources emitting a primary light having a Rb wavelength, the total energy of the plurality of luminescence sources.

[2-3-1] Area of the Light-Outgoing Part in the Luminescence Sources

An area of the light-outgoing part in the luminescence sources means an area per unit which is an area of the surface of the light-outgoing part for a single luminescence source unit, multiplied by, for example, the number of luminescence sources for a wavelength in each range of Rb, Rg and Rr described above.

Thus, the energy ratio of light-outgoing parts can be controlled by adjusting the number of luminescence sources for the wavelength in each region of Rb, Rg and Rr.

Therefore, when factors determining the energy amount other than the area of the light-outgoing part in each range of Rb, Rg and Rr are for example identical, the area of the light-outgoing part in the luminescence sources for each wavelength can be used as the energy of the light-emitting part in the luminescence sources to calculate the above energy ratio.

[2-3-2] Light-Outgoing Time of the Luminescence Sources

A light-outgoing time of the luminescence sources means a light-outgoing time per unit which is the light-outgoing time in a certain time for a single luminescence source unit, multiplied by, for example, the number of luminescence sources for the wavelength in each range of Rb, Rg and Rr described above.

Thus, the energy ratio of light-outgoing parts can be controlled by adjusting the light-outgoing time of the luminescence sources for the wavelength in each region of Rb, Rg and Rr.

Therefore, when factors determining the energy amount other than the light-outgoing time in each range of Rb, Rg and Rr are for example identical, the light-outgoing time in the luminescence sources for each wavelength can be used as the energy of the light-emitting part in the luminescence sources to calculate the above energy ratio.

Furthermore, the above energy ratio can be arbitrarily changed by adding a controller which controls the light-outgoing time as one of driving conditions of the luminescence sources for each range of Rb, Rg and Rr. Thus, there can be provided the illuminating device in which a brightness, a color temperature and a saturation of a composite light emitted from the light-emitting part are variable, and lighting properties can be arbitrarily adjusted as desired.

A specific controller controlling the light-outgoing time may be based on a common alternating-current power system (50/60 Hz) or a high-frequency circuit, and may utilize PWM controlling making luminescence sources emitting a light as a pulse.

[2-3-3] Driving Current of the Luminescence Sources

A driving current of the luminescence sources means a driving current per unit as the driving current for a single luminescence source unit, multiplied by, for example, the number of luminescence sources for the wavelength in each range of Rb, Rg and Rr described above. When the luminescence sources are of the same type, a driving voltage is substantially equal.

Thus, the energy ratio of the light-outgoing parts can be controlled by adjusting the driving current of the luminescence sources for the wavelength in each region of Rb, Rg and Rr.

Therefore, when factors determining the energy amount other than the driving current in each range of Rb, Rg and Rr are for example identical, the driving current in the luminescence sources for each wavelength can be used as the energy of the light-emitting part in the luminescence sources to calculate the above energy ratio.

Furthermore, the above energy ratio can be arbitrarily changed by adding a controller which controls the driving current as one of driving conditions of the luminescence sources for each range of Rb, Rg and Rr. Thus, there can be provided the illuminating device in which a brightness, a color temperature and a saturation of a composite light emitted from the light-emitting part are variable, and lighting properties can be arbitrarily adjusted as desired.

[2-3-4] Electric Energy of the Luminescence Sources (Driving Current×Voltage)

An electric energy of the luminescence sources means an electric energy per unit as the electric energy for a single luminescence source unit, multiplied by, for example, the number of luminescence sources for the wavelength in each range of Rb, Rg and Rr described above. When the luminescence sources are of different types (for example, an element structure, an element size, a wavelength and so on), a driving voltage is different.

Thus, the energy ratio of the light-outgoing parts can be controlled by adjusting the electric energy of the luminescence sources for the wavelength in each region of Rb, Rg and Rr.

Therefore, when factors determining the energy amount other than the electric energy in each range of Rb, Rg and Rr are for example identical, the electric energy in the luminescence sources for each wavelength can be used as the energy of the light-emitting part in the luminescence sources to calculate the above energy ratio.

Furthermore, the above energy ratio can be arbitrarily changed by adding a controller which controls the electric energy as one of driving conditions of the luminescence sources for each range of Rb, Rg and Rr. Thus, there can be provided the illuminating device in which a brightness, a color temperature and a saturation of a composite light emitted from the light-emitting part are variable, and lighting properties can be arbitrarily adjusted as desired.

[2-3-5] Arrangement of Luminescence Sources

Factors contributing to light modulation other than the above energy ratio may include proper arrangement of luminescence sources for the individual wavelengths described above. Examples of a proper arrangement for combining three color luminescence sources (red, green, blue).

(i) Uniform white can be obtained by an arrangement where red, green and blue are mutually adjacent while preferably avoiding sources with the same color being adjacent. In such a case, when the energy ratio of red, green and blue is adjusted by the area ratio, uniform white can be obtained by combining patterns in each of which red, green or blue is rich. For example, FIGS. 4(a) to (d) show four examples of a pattern in which a rate of a red area is larger. Color may be altered between red, green and blue. Furthermore, the patterns in FIGS. 4(a) to (d) can be appropriately combined as a module.

(ii) The sources can be arranged such that red, green and blue are mutually adjacent and some of the sources having the same color are adjacent. For example, FIGS. 4(e) to (h) show four examples of a pattern where an area ratio of red, green and blue is fixed and an energy ratio is adjusted by a driving electric energy or driving current. Color may be altered between red, green and blue. Furthermore, the patterns in FIGS. 4(e) to (h) can be appropriately combined as a module.

Figures 4, 5:
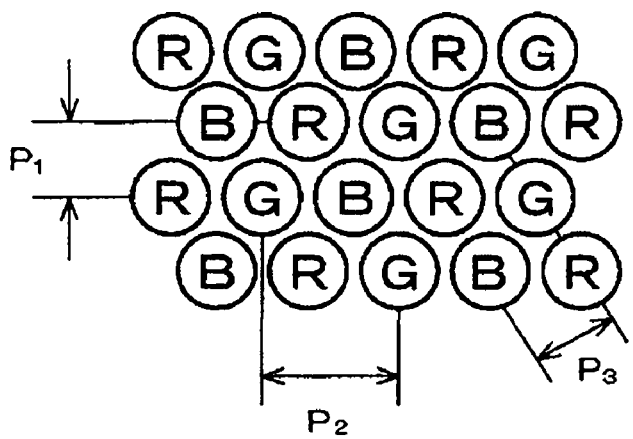
FIG. 4 is a schematic view showing an exemplary configuration of luminescence sources of an illuminating device according to the present invention.
FIG. 5 is a schematic view showing an exemplary configuration of luminescence sources of an illuminating device according to the present invention.

(iii) As shown in FIG. 5, a regular triangle minimum unit which is a closest packing of one red, one green and one blue is arranged as a repeating unit for reducing a distance (pitches $P_1$, $P_2$, $P_3$) between three color luminescence sources (red, green, blue). Reducing pitches $P_1$, $P_2$, $P_3$ can reduce a color mixing distance between the three color luminescence sources (red, green, blue).

(iv) Another example of the arrangement with a narrower distance (pitch) between three color luminescence sources (red, green, blue) is a honeycomb structure where a conventional arrangement with square luminescence sources is inclined at a 45 degree angle as shown in FIG. 6(a). In comparison with a conventional arrangement with square luminescence sources (FIG. 6(b)), the structure can effectively reduce the color mixing distance between three color luminescence sources (red, green, blue).

Figure 6:
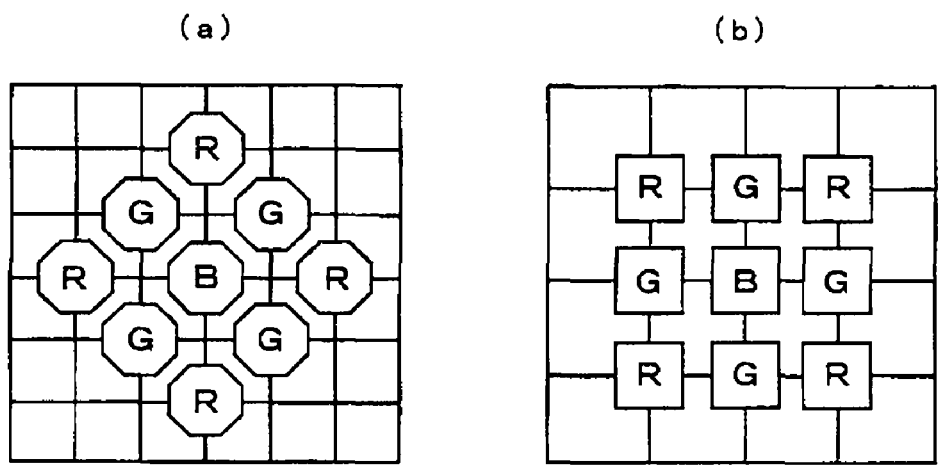
FIG. 6 is a schematic view showing an exemplary configuration of luminescence sources of an illuminating device according to the present invention.

In FIGS. 4 to 6, B, G and R represent luminescence sources for wavelengths of blue(Rb), green (Rg) and red (Rr), respectively.

[3] Illuminating Device

[3-1] Illumination Intensity

In the illuminating device according to the present invention, the illumination intensity of the composite light is 150 lux or more at a perpendicular distance of 30 cm from the light-emitting surface in the light-emitting part described above.

Although a light-emitting device using a conventional LED and a phosphor sometimes uses a composite light for image display, there have been no specific concepts utilizing it for lighting. It, therefore, does not contemplate a configuration or structure where the illumination intensity is adjusted to be a certain value or more at a distance of 30 cm. The illuminating device according to the present invention can be clearly distinct from a conventional light-emitting device (backlight) as an image display, in which a technical significance of the present invention consists.

In the illuminating device according to the present invention, the illumination intensity at a distance of 30 cm perpendicularly from the light-emitting surface in the light-emitting part is 150 lux or more, more preferably 300 lux or more, particularly preferably 500 lux or more. If this illumination intensity is too low, the composite light is so weak that the illuminated surface may become too dark for the light source of this embodiment to be used for the illuminating device (hereinafter, appropriately referred to as "illumination"), and if it is too high, the composite light may be too bright for the light source of this embodiment to be used as the illumination. On the other hand, quality of the illumination is not determined only by the illumination intensity and impression also depends on the color temperature and color rendering properties, so that comprehensive performance is important.

For achieving the above illumination intensity in the illuminating device according to the present invention, specifically the structure, the number and the disposition of the integrated luminescence sources are appropriately selected depending on the size of the illuminating device and a required illumination intensity.

[3-2] Illumination Color

The illuminating device according to the present invention preferably gives a white composite light observed at a distance of at least 10 cm perpendicularly to the light-emitting surface of the light-emitting part.

Generally, the illumination is required to be as white as possible and to have color rendering properties so that an observer can accurately perceive an object color. For example, the object color cannot be correctly perceived under a red, an yellow or a sodium lamp. Thus, the illumination color by the illuminating device according to the present invention is preferably white or pastel color as a whitish color.

The illumination color can be achieved by adjusting a mixing ratio of individual colors of the above luminescence sources (for example, blue, green and red). For example, when a rate of red luminescence sources is increased, a reddish-white color is obtained.

A position where the composite light by the illuminating device according to the present invention is observed to be white is at a distance of preferably at least 10 cm or more, more preferably 5 cm or more perpendicularly to the light-emitting surface of the light-emitting part. When a position where white is observed is too short, color separation may occur on an illuminated surface.

If color separation in the illumination side occurs within the surface illuminated by white color, an object color cannot be correctly perceived. Particularly, this color separation tends to occur in a white LED provided by using a light from a semiconductor light-emitting element emitting blue light with a wavelength of 430 nm or more and phosphors emitting yellow or green and red after excitation by this light and mixing a blue of the excitation light and the emitted lights of the phosphors. It is because color mixing is insufficient due to difference in light distribution properties between blue as an excitation light and emitted lights of phosphors. A pastel color as a white or whitish light in the present invention is not obtained by mixing with the excitation light but by mixing of the excitation lights from the above solid light-emitting elements, for example, emitted lights from phosphors as blue, green and red.

[3-3] Color Temperature

A color temperature of the composite light in this embodiment can be also arbitrarily adjusted, depending on, for example, its application, and usually 2000 K or more, preferably 2500 K or more, more preferably 2700 K or more and usually 12000 K or less, preferably 10000 K or less, more preferably 7000 K or less. The light within this range is used widely because cold and warm colors look good. If it is beyond this range, the light source of this embodiment cannot be used in the illuminating device for a general application. The color temperature of the composite light can be determined by, for example, a colorimeter or radiometer.

[3-4] Luminescent Efficiency

In the illuminating device of this embodiment, a luminescent efficiency of the composite light is usually 30 lm/W or more, preferably 50 lm/W or more, more preferably 80 lm/W or more. An excessively low luminescent efficiency may lead to increase in an energy cost required for the use and thus required properties for the illuminating device with a higher energy efficiency are not met. An excessively low luminescent efficiency may lead to element destruction due to heat generation when luminescence sources are integrated as an image display. The luminescent efficiency of the luminescence sources can be determined by, for example, dividing a light flux of the composite light measured by an integrating sphere by a supplied electric power.

[3-5] Average Color Rendering Index Ra

The illuminating device of the present invention has an average color rendering index Ra of 80 or more, preferably 85 or more, particularly preferably 90 or more, which indicates substantially excellent color rendering properties.

The above average color rendering index Ra is calculated in accordance with JIS Z 8726.

[3-6] Features of a Composite Light Spectrum

Furthermore, a spectrum of the composite light in this embodiment is generally a combination of primary light spectra. The spectrum of the composite light is preferably a continuous visible light for providing the illuminating device exhibiting good color rendering properties, more preferably a light close to Planck's radiation as much as possible.

The composite light spectrum can be measured by a spectrophotometer.

EXAMPLES

There will be more specifically described the present invention with reference to Examples, but the present invention is not limited to Examples described below as long as it is within the scope of the invention.

[E1] Preparation of LED lamps

A package was an SMD type package made of PPA with an outer size of 3.5 mm ×2.8 mm and a sealing material was a one-component transparent silicone resin.

A semiconductor light-emitting element and a phosphor were as described below, and a red, a green and a blue LED lamp were prepared in each of Examples 1 and 2 and Comparative Example 3. In Comparative Examples 1 and 2, a white LED lamp was prepared.

[E1-1] Semiconductor Light-Emitting Element

[E1-1-1] Example 1, Example 2 and Comparative Example 1

There was used a InGaN light-emitting diode (LED) having a square shape with a size of 300 μm×300 μm in which a peak wavelength was 405 nm and a full width at half maximum was 30 nm.

[E1-1-2] Comparative Example 2

There was used a blue InGaN light-emitting diode (LED) having a square shape with a size of 300 μm×300 μm in which a peak wavelength was 460 nm and a full width at half maximum was 30 nm.

[E1-1-3] Comparative Example 3

There were used a blue InGaN light-emitting diode (LED) with a peak wavelength of 460 nm, a green InGaN light-emitting diode (LED) with a peak wavelength of 520 nm and an orange AlInGaP light-emitting diode (LED) with a peak wavelength of 620 nm.

[E1-2] Phosphor

[E1-2-1] Example 1, Comparative Example 1

Blue, green and red phosphors described below were used.

Blue phosphor (B1): $Ba_{0.7}Eu_{0.3}MgAl_{10}O_{17}$, a peak wavelength of a major emission peak: 457 nm, a weight median size: 11 μm.

Green phosphor (G1): $Ba_{1.39}Sr_{0.46}Eu_{0.15}SiO_4$, a peak wavelength of a major emission peak: 525 nm, a weight median size: 20 μm.

Red phosphor (R1): $Sr_{0.792}Eu_{0.008}Ca_{00.2}AlSiN_3$, a peak wavelength of a major emission peak: 628 nm, a weight median size: 9 μm.

[E1-2-1] Example 2

Blue and green phosphors were as described in Example 1, and a red phosphor was as described below.

Red phosphor (R2): $Ca_{0.992}Eu_{0.008}AlSiN_3$, a peak wavelength of a major emission peak: 650 nm, a weight median size: 9 μm.

[E1-2-2] Comparative Example 2

An yellow phosphor as described below was used.

Yellow phosphor (Y1): $(Y,Gd)_3Al_5O_{12}$:Ce, a peak wavelength of a major emission peak: 565 nm, a weight median size: 8 μm.

[E2] Preparation of an Illuminating Device

The LED lamps obtained in [E1] were integrated in the arrangement described below to prepare an illuminating device.

[E2-1] Example 1, Example 2 and Comparative Example 3

Figure 7:
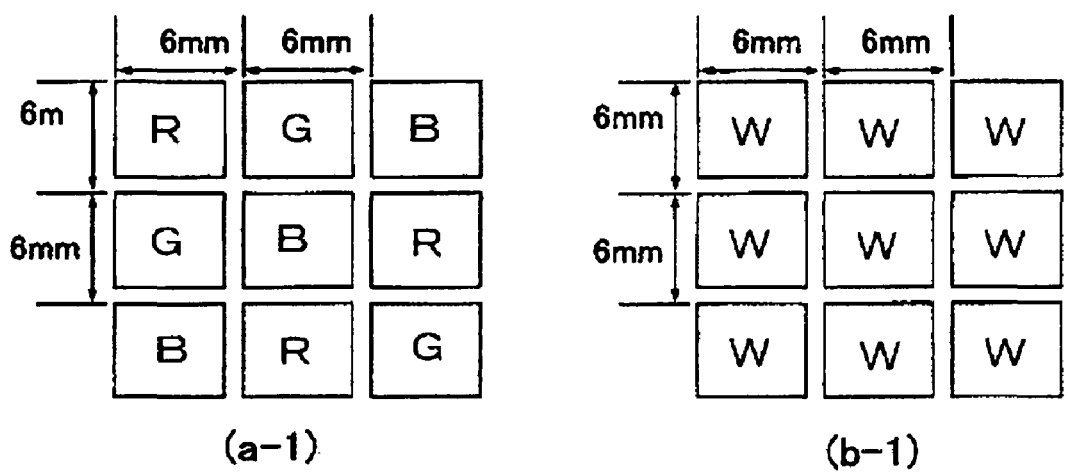
FIG. 7 is a schematic view showing a configuration of integrated LEDs in illuminating devices prepared in Examples 1 and 2 and Comparative Examples 1 to 3.
Figure 7:
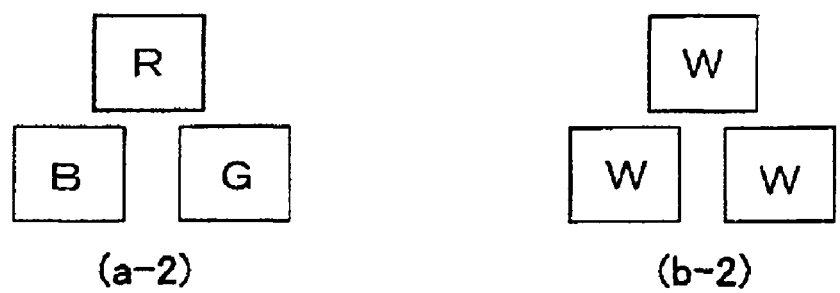

These are as shown in FIGS. 7(*a*-1) and (*a*-2).

[E2-2] Comparative Example 1 and Comparative Example 2

These are as shown in FIGS. 7(*b*-1) and (*b*-2).

[E3] Property Evaluation

The illuminating device obtained in [E2] was evaluated for
1) an energy ratio of red, green and blue luminescence sources, and
2) a color mixing distance, an illumination intensity, a color temperature, a luminescent efficiency and an average color rendering index (Ra) of the illuminating device.

Figure 8:
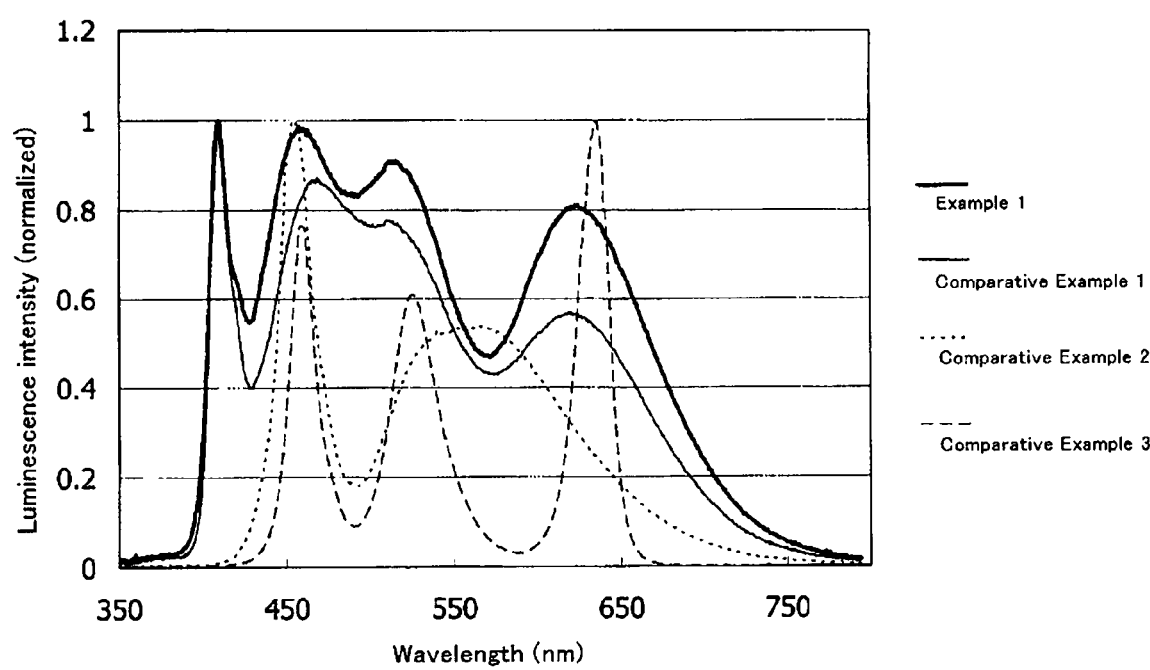
FIG. 8 is a graph showing emission spectra of the illuminating devices prepared in Example 1 and Comparative Examples 1 to 3.

The evaluation results are shown in Table 2. The emission spectra for the illuminating devices in Example 1 and Comparative Example 1 to 3 are shown in FIG. 8.

The measuring conditions of *i) and *ii) in the table are as follows.
i) Measurement Conditions (the Configuration in FIGS. 7(*a*-1) and (*b*-1))

Driving current: 20 mA

Color mixing distance: a white-light scattering sheet is illuminated by a light source from above and then a distance where color separation becomes visually indistinguishable is recorded.

Illumination intensity: measured using an illumination intensity measuring device "Im-5" from TOPCON at a distance of 20 cm from a light source perpendicularly disposed.

Color temperature: measured by an spectral radiance meter "CS-1000" from Konica Minolta Holdings, Inc.

ii) Measurement Conditions (the Configuration in FIGS. 7(a-2) and (b-2))

Driving current: driving currents for RGB are adjusted for matching chromaticity (5 to 20 mA).

Luminescent efficiency, average color rendering index, energy ratio: determined by an LED evaluating device "OL770" from Optronic Laboratories.

TABLE 2

| | Rb λ(430-500) | | Rg λ(500-580) | | Rr λ(580-700) | | Energy | White | | Properties | | | | |
|---|---|---|---|---|---|---|---|---|---|---|---|---|---|---|
| | | | | | | | | | | Color mixing distance (cm) *i) | Illumination intensity (lx) *i) | Color temperature (K) *i) | Luminescent efficiency (lm/W) *ii) | Average color rendering index (Ra) *ii) |
| | Blue phosphor | Light emitting element | Green phosphor | Light emitting element | Red phosphor | Light emitting element | ratio E1:E2:E3 *ii) | Phosphor | Light emitting element | | | | | |
| Ex. 1 | (B1) | 405 nm InGaN LED | (G1) | 405 nm InGaN LED | (R1) | 405 nm InGaN LED | 38:26:36 | | | 3 Close | 88 | 6000 to 7000 | 27.5 ⊚ | 88 to 91 ○ |
| Ex. 2 | (B1) | 406 nm InGaN LED | (G1) | 405 nm InGaN LED | (R2) | 405 nm InGaN LED | 37:27:36 | | | 3 Close | 82 | 6000 to 7000 | 25 Δ | 90 to 93 ○ |
| Comp. Ex. 1 | | | | | | | | (B1) + (G1) + (R1) | Near ultraviolet InGaN LED | | 50 | 6000 to 7000 | 25.9 Δ | 89 to 92 ○ |
| Comp. Ex. 2 | | | | | | | | (Y1) | Blue InGaN LED | | (None) | 7000 to 10000 | 30 ○ | 72 to 75 Δ |
| Comp. Ex. 3 | | Blue InGaN LED | | Green InGaN LED | | Orange AlIn GaP LED | 28:38:34 | | | 20 Far | 50 | 6000 to 7000 | 44.7 ⊚ | 48 X |

From these examples and comparative examples, it was found that a light-emitting unit as a combination of primary lights of monochromatic LEDs of the phosphors in Example 1 exhibited a better luminescent efficiency than the white LED where the phosphors in Comparative Example 1 were mixed. It was furthermore observed that a color blending distance is smaller for a light-emitting unit as a combination of primary lights of monochromatic LEDs of the phosphors than for a light-emitting unit as a combination of primary lights of monochromatic LEDs of Comparative Example 3. From the results, an approach of combining primary lights from a plurality of luminescence sources generating primary lights with different wavelengths can provide an illuminating device exhibiting comprehensively excellent performance.

Although a light output of the LED with a peak wavelength of 405 nm used in Example 1 was 6 mW without resin sealing, an illuminating device with a luminescent efficiency of 55 lm/W can be provided by using an LED with a high output of 12 mW.

The invention claimed is:

1. An illuminating device comprising:
a light-emitting part having more than one kind of luminescence sources disposed integrally, each kind of which emits a primary light with a different wavelength, wherein each luminescence source includes a solid light-emitting element and a phosphor,
the primary light emitted from the luminescence sources are mixed as a composite light at a distance of at least 3 cm from a light emitting surface,
an illumination intensity of the composite light at a distance of 30 cm from a light-emitting surface of said light-emitting part in a perpendicular direction is 150 lux or more,
each luminescence source comprises a solid light-emitting element module formed by assembling said solid light-emitting elements as a solid light-emitting element module and a phosphor module formed by assembling said phosphors as a phosphor module, said solid light-emitting element module includes a plurality of said solid light-emitting elements, said phosphor module contains at least one phosphor at a position corresponding to each of said plurality of solid light-emitting elements, said solid light-emitting element module and said phosphor module are joined to constitute a light-emitting part where said more than one kind of luminescence sources are disposed integrally, said phosphor module is separately removable from the illuminating device, and said phosphor module has a phosphor-containing part and a transparent base which is a support for the phosphor-containing part.

2. The illuminating device according to claim 1, wherein the composite light is white when it is observed at a distance of at least 10 cm from the light-emitting surface of said light-emitting part in a perpendicular direction.

3. The illuminating device according to claim 1 or 2, wherein an area of a light-outgoing part of said luminescence sources is 0.1 mm$^2$ to 100 mm$^2$; said luminescence sources emit a light having emission peak wavelengths in a first wavelength range of 430 nm or more and less than 500 nm, a second wavelength range of 500 nm or more and less than 580 nm and a third wavelength range of 580 nm or more and 700 nm or less; and an energy ratio of the light-outgoing part of said luminescence sources is $E_1:E_2:E_3=5$ to 90:5 to 90:5 to 90 where an energy of a light having an emission peak wavelength in said first wavelength range is $E_1$, an energy of a light having an emission peak wavelength in said second wavelength range is $E_2$ and an energy of a light having an emission peak wavelength in said third wavelength range is $E_3$.

4. The illuminating device according to claim 3, further comprising a controller controlling the driving conditions of said luminescence sources for each of said first to third wavelength ranges.

5. The illuminating device according to claim 1, wherein said solid light-emitting element module comprises a base and a solid light-emitting element disposed on said base.

6. The illuminating device according to claim 1, wherein said base is a transparent sheet or plate.

* * * * *

UNITED STATES PATENT AND TRADEMARK OFFICE
CERTIFICATE OF CORRECTION

PATENT NO. : 8,348,456 B2  
APPLICATION NO. : 12/377182  
DATED : January 8, 2013  
INVENTOR(S) : Yoshihito Satou et al.

Page 1 of 1

It is certified that error appears in the above-identified patent and that said Letters Patent is hereby corrected as shown below:

On the title page, Item (86), the Application Filing Date is incorrect. Item (86) should read:

-- (86)  PCT No.:    PCT/JP2007/065627

§ 371 (c)(1),
(2), (4) Date:    Mar. 13, 2009 --

Signed and Sealed this
Second Day of July, 2013

Teresa Stanek Rea
*Acting Director of the United States Patent and Trademark Office*